United States Patent
Hagiwara et al.

(10) Patent No.: US 6,800,188 B2
(45) Date of Patent: Oct. 5, 2004

(54) COPPER PLATING BATH AND PLATING METHOD FOR SUBSTRATE USING THE COPPER PLATING BATH

(75) Inventors: Hideki Hagiwara, Fujisawa (JP); Ryoichi Kimizuka, Fujisawa (JP); Yoshitaka Terashima, Fujisawa (JP); Megumi Maruyama, Fujisawa (JP); Takashi Miyake, Fujisawa (JP); Hiroshi Nagasawa, Tokyo (JP); Tsuyoshi Sahoda, Tokyo (JP); Seiji Iimura, Tokyo (JP)

(73) Assignees: Ebara-Udylite Co., Ltd., Tokyo (JP); Ebara Corporation, Tokyo (JP)

( * ) Notice: Subject to any disclaimer, the term of this patent is extended or adjusted under 35 U.S.C. 154(b) by 182 days.

(21) Appl. No.: 10/140,882

(22) Filed: May 9, 2002

(65) Prior Publication Data

US 2003/0106802 A1 Jun. 12, 2003

(30) Foreign Application Priority Data

May 9, 2001 (JP) ........................................ 2001-138822

(51) Int. Cl.[7] .............................. C25D 3/40; C23C 18/00
(52) U.S. Cl. ........................................ 205/296; 106/1.26
(58) Field of Search ........................... 106/1.26; 205/296

(56) References Cited

U.S. PATENT DOCUMENTS 4,384,930 A    5/1983   Eckles ........................ 204/435
6,518,182 B1 * 2/2003  Ishikawa et al. ............ 438/678

FOREIGN PATENT DOCUMENTS

JP    2000-273684    10/2000

* cited by examiner

Primary Examiner—Edna Wong
(74) Attorney, Agent, or Firm—Wenderoth, Lind & Ponack, L.L.P.

(57) ABSTRACT

A copper plating bath comprising a reaction condensate of an amine compound and glycidyl ether and/or a quaternary ammonium derivative of this reaction condensate, and a plating method using this copper plating bath are disclosed. A copper plating bath capable of providing highly reliable copper plating on a substrate such as a silicone wafer semiconductor substrate or printed board having minute circuit patterns and small holes such as blind via-holes, through-holes, and the like, and a method of copper plating using the copper plating bath can be provided.

33 Claims, 33 Drawing Sheets

COPPER PLATING BATH AND PLATING METHOD FOR SUBSTRATE USING THE COPPER PLATING BATH

FIELD OF THE INVENTION

The present invention relates to a copper plating bath and a plating method for substrates using the copper plating bath. More particularly, the present invention relates to a copper plating bath capable of providing a highly reliable copper plating on a substrate such as a silicone wafer semiconductor substrate or printed board having minute circuit patterns and small holes such as blind via-holes, through-holes, and the like, and to a method of copper plating using the copper plating bath.

DESCRIPTION OF BACKGROUND ART

Recently, a build-up method is being applied to mounting circuits for electronic equipment such as cellular phones, personal computers, videos, game machines, and the like. In the build-up method, small holes such as through-holes and via-holes are provided through a laminated board, and metals are deposited in such small holes to allow interconnection among several different circuit layers, whereby multiplayer circuits are fabricated. Of these small holes, metal deposition in via-holes which are minute blind holes (hereinafter referred to as via-holes) is performed by via-hole plating or via-filling.

With via-hole plating, in which a metal film is formed on the side or bottom inside the via-holes, there are difficulties in layering a conductive layer over the holes. In addition, the area of metal film deposition must be increased to guarantee sufficient conductivity between different circuit layers.

On the other hand, the via-filling method in which metals are filled into via-holes can completely fill the holes with the metals and allow other via-holes to be formed on these holes if the via-hole surface is flat after filling. Therefore, this method is very advantageous for downsizing the devices. For this reason, the demand is being shifted from the via-hole plating method, in which insulating materials (insulating layers) can be flattened only with limitation, to the via-filling method in which connecting holes between the layers can be filled.

Conventionally, via-filling is performed by forming holes between an insulating layer and a conductive layer under the insulating layer, forming pillars or posts by electrolytic copper plating, and flattening the surface by removing deposited copper by grinding. Another method comprises activating only the conductive layer in the bottom of the holes by electroless copper plating and selectively piling by electroless copper plating. Still another method is filling holes with a copper paste and the like.

Of these methods, the first method requires grinding of deposited copper plating layers having a substantial thickness, whereas the second method has a drawback of requiring a considerable period of time to obtain a copper plating layer with a desired thickness. The third method is simple, but has a serious problem in terms of reliability. Because this method employs a paste in which metals are dispersed using a solvent and the like, there are problems such as limited conductivity, formation of voids or shrinkage due to a reduction in volume after filling, and peeling of plate from the internal wall of the holes.

For these reasons, a method of completely filling via-holes by electroplating has been proposed in recent years. Plating solutions and plating methods for this purpose have been developed.

However, the plating solutions and plating methods heretofore proposed have the following drawbacks in practical use. Specifically, many proposed plating solutions utilize a mechanism of filling via-holes using a liquid containing a strong leveling component, such as a dye-type leveling component. Such a leveling component exhibits a strong limitation to diffusion and is adsorbed abundantly on the surface with a thin diffusion layer, whereby metal deposition is controlled on that surface, but comparatively accelerated in recessed areas with a thick diffusion layer (i.e. inside via-holes). Via-filling can be achieved in this manner.

However, although this type of plating solution is suitable for a panel plating method for plating the entire surface of the substrates, the leveling component is easily affected by the thickness of the diffusion layer and the flow rate of the plating solution when applied to a substrate in which circuits are previously patterned by a resist or the like or a substrate with both patterns and through-holes. As a result, the metal thickness significantly differs in the center or ends of vias or wires, or a metal may become thick only in the through-hole entrance corners or the one side of the through-hole internal walls, impairing reliability on laminated layers and electric properties.

Although a method of plating using a pulse wave-form has also been proposed, the method not only involves high cost for the facility which results in a high production cost, but also a problem of complicated electric current control.

Furthermore, conventional plating solutions result in difficulty in analysis and control due to inclusion of three or more components as additives. The difficulty in analysis and control impairs dense filling properties, uniformity of film thickness in pattern plating, and maintenance of consistent properties, thereby significantly affecting the yield and cost of the products.

Therefore, development of a technology for highly reliable plating of substrates, particularly those having small holes and minute grooves for wiring, has been desired.

DISCLOSURE OF THE INVENTION

As a result of extensive studies on plating baths for a long period of time to solve the above-described problems, the inventors of the present invention have found that a copper plating bath containing certain components exhibits excellent via-filling characteristics and plating uniformity, can plate co-existing through-holes with superior plating uniformity, and can produce copper plating with high electric reliability on electric circuit boards such as semiconductor wafers having circuits patterns with minute wiring grooves, printed circuit boards, and the like, with an additional advantage of allowing easy analysis of major components of the plating bath.

Specifically, the present invention provides a copper plating bath comprising a reaction condensate of an amine compound and glycidyl ether and/or a quaternary ammonium derivative of this reaction condensate.

The present invention further provides a method of plating a substrate comprising providing a patterned substrate with electro conductivity and plating the substrate using the copper plating bath.

The present invention also provides an additive used for the copper plating bath.

DETAILED DESCRIPTION OF THE PREFERRED EMBODIMENT

Figure 1:
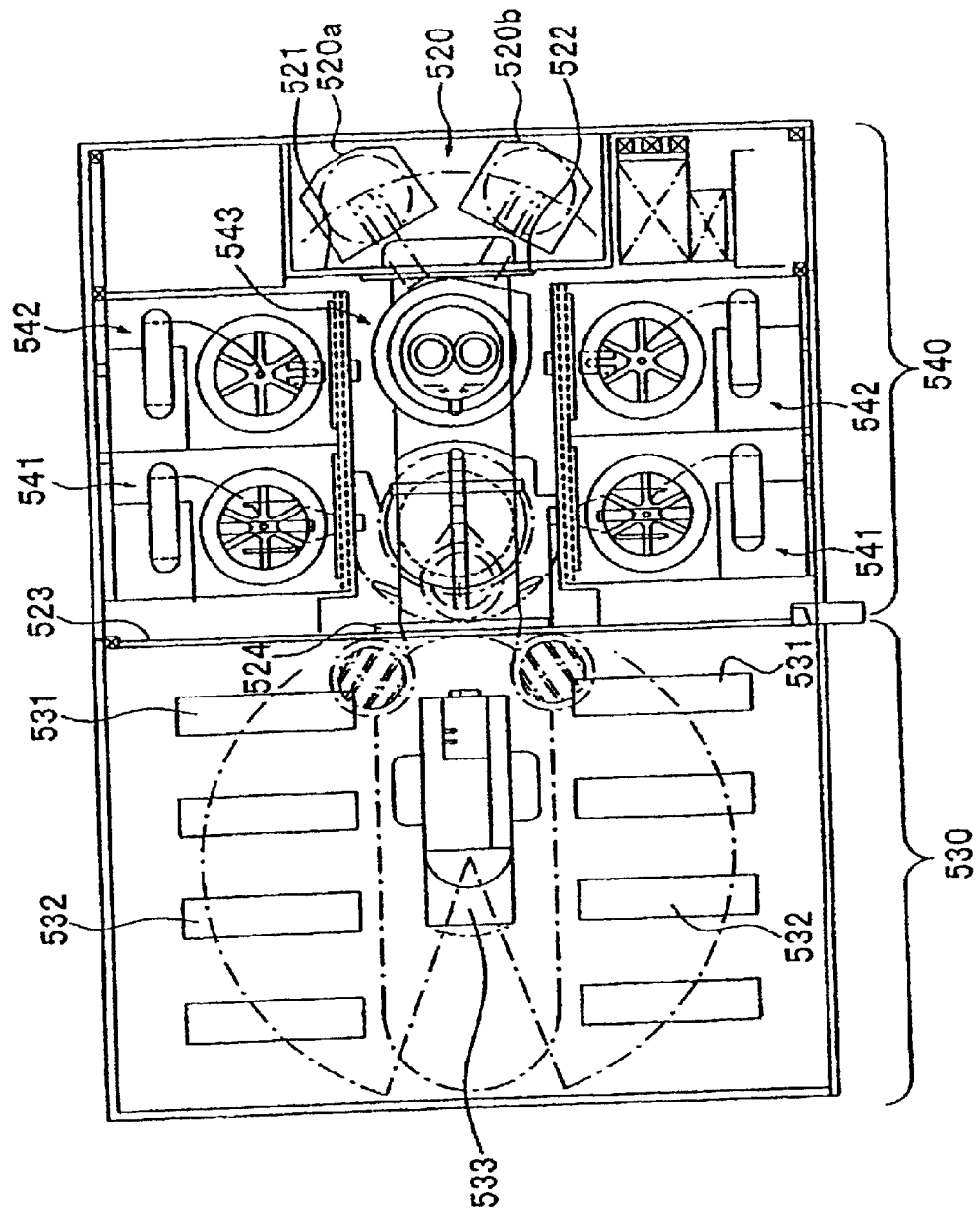
FIG. 1 is a plane arrangement diagram showing one example of a substrate processing unit using the plating method of the present invention.

The copper plating bath of the present invention is characterized by comprising a reaction condensate of an amine compound and glycidyl ether and/or a quaternary ammonium derivative of such a reaction condensate as an essential component. The component suppresses deposition of copper on the surface or protrusions and preferentially plates recesses of a substrate. Specifically, the component acts as an additive for filling the recesses with copper.

Because the reaction condensate is only slightly affected by the flow rate and stirring rate of the plating solution and is stable in the plating bath, it is possible to obtain excellent copper plating with high lamination reliability and electric reliability. In addition, analysis and control of the copper plating bath becomes easy because the reaction condensate can be added in a larger amount than conventional additives, making a higher concentration.

Such characteristics of the reaction condensate are thought to be due to the structure of the reaction condensate although the details are not clear. The reaction condensate is thought to be weakly charged cationically in the plating bath even if the nitrogen group is not cationized in the condensate molecule. Quaternary ammonium derivatives of the condensate are also thought to be cationized and therefore exhibit a similar action with the reaction condensate.

Examples of amines used as one of the raw materials of the reaction condensate include ethylenediamine, trimethyldiamine, propylenediamine, hexamethylenediamine, N-phenylethylenediamine, dimethylamine, diethanolamine, diethylaminopropylamine, and the like.

Examples of glycidyl ethers used as the other raw material of the reaction condensate include phenyl glycidyl ether, allyl glycidyl ether, o-phenylphenyl glycidyl ether, butyl glycidyl ether, glycidyl methyl ether, glycidyl p-nitrophenyl ether, glycidyl isopropylphenyl ether, glycidyl methoxyphenyl ether, glycidyl 2-ethylphenyl ether, ethylene glycol glycidyl ether, polyethylene glycol diglycidyl ether, glycerol glycidyl ether, polyglycerol polyglycidyl ether, and the like.

As specific examples of the reaction condensate of the amine compound and glycidyl ether or the quaternary ammonium derivative thereof (hereinafter referred to from time to time as "reaction condensates and the like"), compounds shown by the following formulas (I)–(IV) can be given.

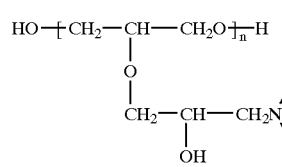
(I)

wherein n represents an integer of 1–10, and $R_1$ and $R_2$ individually represent a hydrogen atom, an alkyl group having 1–10 carbon atoms which may be either substituted or unsubstituted, or an alkenyl group which may be either substituted or unsubstituted.

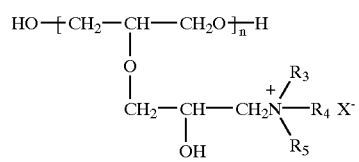
(II)

wherein n represents an integer of 1–10, $R_3$ to $R_5$ individually represent a hydrogen atom, an alkyl group having 1–10 carbon atoms which may be either substituted or unsubstituted, or an alkenyl group which may be either substituted or unsubstituted, and X- represents a halogen ion.

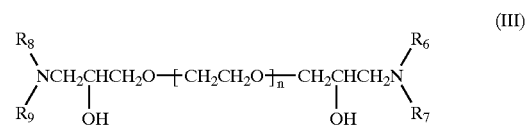
(III)

wherein n represents an integer of 1–10, and $R_6$ to $R_9$ individually represent a hydrogen atom, an alkyl group having 1–10 carbon atoms which may be either substituted or unsubstituted, or an alkenyl group which may be either substituted or unsubstituted.

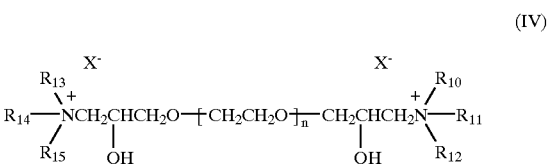
(IV)

wherein n represents an integer of 1–10, $R_{10}$ to $R_{15}$ individually represent a hydrogen atom, an alkyl group having 1–10 carbon atoms which may be either substituted or unsubstituted, or an alkenyl group which may be either substituted or unsubstituted, and X- represents a halogen ion.

Compounds shown by the following formulas (V) to (XX) can be given as a specific preferable example of the reaction condensates and the like:

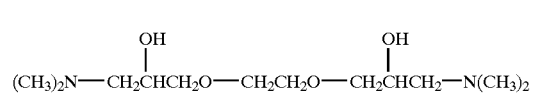
(V)

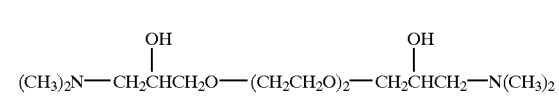
(VI)

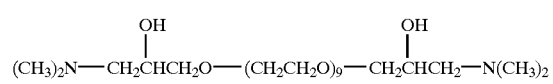
(VII)

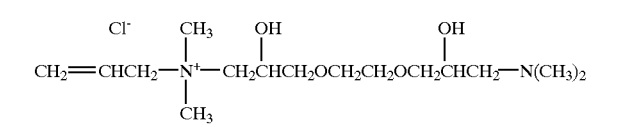
(VIII)

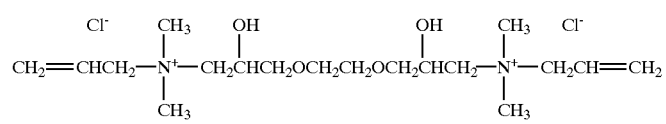
(IX)

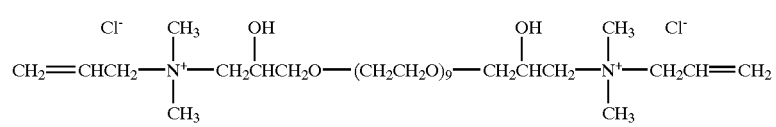
(X)

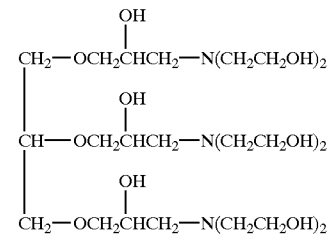

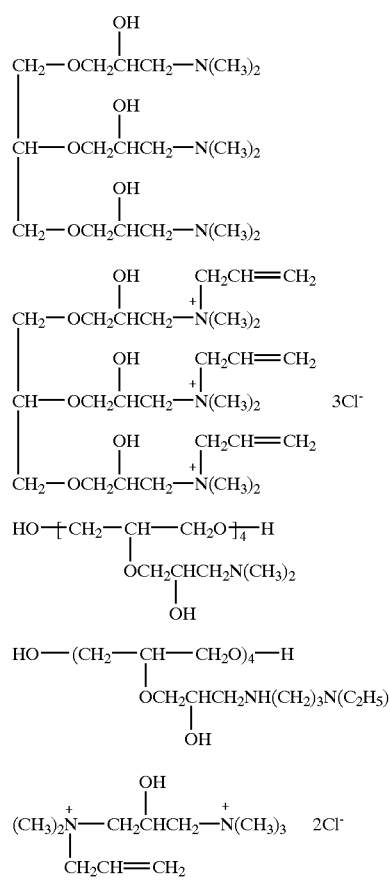

These reaction condensates and the like can be prepared from the above-described amines and glycidyl ethers by a conventional reaction-condensation reaction, or optionally by converting the reaction condensate into a quaternary ammonium salt. For example, the following condensation methods can be employed.

Specifically, the compound of the formula (V) can be prepared by dissolving ethylene glycol diglycidyl ether in water, adding a 50% dimethylamine aqueous solution to the solution, stirring the mixture for about 30 minutes at room temperature, and condensing and drying the resultant reaction mixture under reduced pressure.

The compound (quaternary ammonium derivative) of the formula (IX) can be prepared by dissolving the compound of the formula (V) obtained above in acetone and water, adding allyl chloride, heating the mixture while refluxing, and condensing and drying the resultant reaction mixture under reduced pressure. The reaction condensates and the like of the other formulas can also be obtained according to the similar method. These reaction condensates and the like are commercially available under the trademarks such as KB-12 (Goo Chemical Co., Ltd.), for example. These commercially available products can also be used.

These reaction condensates of an amine compound and glycidyl ether or the quaternary ammonium derivatives of the reaction condensate may be used either individually or in combination of two or more. The concentration of the component is 10–1,000 mg/L, and preferably 50–500 mg/L, of the copper plating bath.

Any copper compounds used in conventional copper plating bathes can be used without any specific limitations as a copper ion source in the copper plating bath of the present invention. Specific examples include copper sulfate, copper oxide, copper chloride, copper carbonate, copper pyrophosphate, a copper alkane sulfonate such copper methanesulfonate and copper propanesulfonate, a copper alkanol sulfonate such as copper isethionate and copper propanolsulfate, a copper salt of organic acid such as copper acetate, copper citrate, and copper tartarate, as well as salts of the copper compounds. These copper compounds may be used either individually or in combination of two or more.

The concentration of the copper ion is 25–75 g/L, and preferably 35–60 g/L, of the copper plating bath.

Although metallic copper is a major component of the copper plating bath of the present invention, the plating bath may contain other metals such as Ge, Fe, In, Mn, Mo, Ni, Co, Pb, Pd, Pt, Re, S, Ti, W, Cd, Cr, Zn, Sn, Ag, As, Au, Bi, Rh, Ru, and Ir.

Any organic acids and inorganic acids may be used in the copper plating bath of the present invention without any specific limitations inasmuch as such organic or inorganic acids can dissolve copper. Specific preferable examples include sulfuric acid, alkane sulfonic acids such as methanesulfonic acid and propanesulfonic acid, alkanol sulfonic acids such as isethionic acid and propanolsulfonic acid, and organic acids such as citric acid, tartaric acid, and formic acid. These organic acids and inorganic acids may be used either individually or in combination of two or more. It is desirable that the copper plating bath of the present invention be maintained acidic.

The concentration of the organic acid or inorganic acid is preferably 10–200 g/L, and more preferably 20–100 g/L, of the copper plating bath.

The copper plating bath of the present invention may further contain a sulfoalkyl sulfonic acid or its salt, a bissulfo organic compound, and a dithiocarbamic acid derivative. These compounds are additives commonly called a carrier component or a brightener. Specific examples include the following compounds.

(1) A sulfoalkyl sulfonic acid or its salt of the following formula (XXI):

$$HS-L_1-SO_3M_1 \quad (XXI)$$

wherein $L_1$ represents a saturated or unsaturated alkylene group having 1–18 carbon atoms and M1 represents a hydrogen atom or an alkali metal.

(2) A bis-sulfo organic compound of the following formula (XXII):

$$X_1-L_2-S-S-L_3-Y_1 \quad (XXII)$$

wherein $X_1$ and $Y_1$ represent a sulfate of phosphate reside and $L_2$ and $L_3$ represent saturated or unsaturated alkylene group having 1–18 carbon atoms.

(3) A dithiocarbamic acid derivative of the following formula (XXIII):

(XXIII)

wherein both $R_3$ and $R_4$ groups represent a hydrogen atom or a lower alkyl group having 1–3 carbon atoms, $L_4$ represents an alkylene group having 3–6 carbon atoms, and $X_2$ represents a sulfate or phosphate residue.

These components may be used either individually or in combination of two or more. The concentration of these components is preferably 0.1–200 mg/L, and more preferably 0.3–20 mg/L, of the copper plating bath.

Chlorine ions are preferably present in addition to the above components in the copper plating bath of the present invention at a concentration of preferably 0.01–100 mg/L, and more preferably 10–60 mg/L as chlorine.

In addition to the above components, the copper plating bath of the present invention may contain polyethers commonly used in copper plating bath, specifically polymers such as polyethylene glycol, polypropylene glycol, pluronic-type surfactants, tetronic-type surfactants, polyethylene glycol-glyceryl ether, polyethylene glycol-dialkyl ether, and wetting agents for decreasing surface tension, polyalkylene imine and alkyl imidazoline compounds which are commonly called levelers, alkyl imidazoline compounds, auramine and its derivatives, phthalocyanine compounds, organic dyes as Janus green, and the like.

The copper plating bath of the present invention can be prepared according to a conventional method. Particulars of the method can be appropriately determined taking the components and their amounts in the composition into consideration.

A preferable process for performing the plating method of the present invention using the above-described copper plating bath will now be described.

The object on which the copper plating of the present invention is applied is a substrate with a pattern of conductive film. The substrate may have blind via-holes with a diameter of about 30–200 μm and a depth (the resin layer thickness) of about 20–100 μm. In addition to the via-holes, the substrate may contain trenches (or grooves) for microwiring or through-holes penetrating the substrate.

The plating method of the present invention can ensure copper plating with high electric reliability on semiconductor substrates such as silicon wafer and printed circuit boards with minute circuit patterns provided on the surface. The minute circuit patterns on the substrates are formed from very small trenches and holes which are filled with metallic copper to provide a circuit wiring. As an example of substrate for electric circuit board used in the plating method of the present invention, a substrate having trenches with a width of about 0.05–10 ?m and a depth of about 0.4–1 μm can be given.

Specific examples of such a substrate are printed boards such as a package substrate for directly installing IC bear chips, silicon wafers for directly installing LSI and the like, and silicon wafer substrates and the like for producing semiconductor chips.

These substrates may be pretreated by a conventional method, if necessary. As a pretreatment, it is preferable to form a barrier layer of Ta, TaN, TiN, WN, SiTiN, CoWP, CoWB, or the like when the substrate is a silicon substrate such as a silicon wafer or the like.

In the plating method of the present invention, a conductivity treatment, which is a treatment of forming a metallic seed layer for supplying electric charge to the substrate, is performed prior to copper plating. The conductivity treatment can be carried out by any conventional conductivity treatment method, for example, a metal (including carbon) coating treatment by electroless plating, a direct plating method using carbon or palladium, spattering, vapor deposition, or chemical vapor deposition (CVD). The conductivity treatment is generally performed on a substrate after patterning, but patterns may be provided on a substrate after conductivity treatment.

The substrate after conductivity treatment is then plated with copper using the copper plating bath. The copper plating bath of the present invention is prepared by a conventional method. Plating using the copper plating bath can also be carried out under the same conditions applied to conventional copper sulfate plating. Specific conditions may be a bath temperature between 23–27° C. and a cathode current density of about 1–3 A/dm². Stirring by aeration or circulation using a pump is preferably applied.

The time required for plating a patterned substrate with blind via-holes and completely filling the via-holes using the above-described method of the present invention described above varies according to the diameter and depth of the via-holes. For example, via-holes having a diameter of 100 μm and a depth of 50 μm may require plating for about 60 minutes at a cathode current density of about 2 A/dm². Plating with a thickness of about 20 μm is produced on the surface (excluding the areas of the via-holes) by the plating operation.

In the case of a substrate such as a silicon wafer for fabrication of semiconductors, plating for about 150 seconds at a cathode current density of about 2 A/dm² is sufficient to completely fill via-holes or minute wiring grooves having a diameter of about 0.1–0.5 μm and a depth of 0.5–1 μm, for example. In this instance, plating with a thickness of about 1 μm is produced on the surface (excluding the areas of the via-holes) by the plating operation.

In addition to a wide range of controllable additive's concentration, one outstanding feature of the present invention is capability of easy analysis of all additive components using commercially available common electrochemical instrument employing a cyclic voltammetric stripping (CVS) method. This feature allows control of additive's concentration in a stable manner and ensures high quality and high yield, resulting in significant cost down.

The plating method of the present invention described above is applicable using various plating processes and apparatuses. As examples of the apparatus for advantageously performing the method of the present invention, several substrate processing units having a plating process section will be described below.

FIG. 1 shows a plane arrangement view of one example of a substrate processing unit having a plating process section for carrying out the plating method of the present invention. As shown in the Figure, the substrate processing unit has a carrying in-carrying out area 520 for delivery of substrate cassettes containing semiconductor substrates, a process area 530 to perform processing including the plating process, and a washing-drying area 540 to wash and dry semiconductor substrates after processing. The washing-drying area 540 is arranged between the carrying in-carrying out area 520 and the process area 530. A partition 521 is provided between the carrying in-carrying out area 520 and washing-drying area 540, and a partition 523 is provided between the washing-drying area 540 and process area 530.

Partition 521 is provided with a passage (not shown) for delivery of semiconductor substrates between the carrying in-carrying out area 520 and washing-drying area 540. A shutter 522 for closing and opening the passage is also provided. Partition 523 is also provided with a passage (not shown) for delivery of semiconductor substrates between the washing-drying area 540 and process area 530, and a shutter 524 for closing and opening the passage is also provided. The washing-drying area 540 and the process area 530 are designed individually to supply and exhaust air.

The substrate processing unit for semiconductor board wiring having this configuration is installed in a clean room. The pressure in each area is set to satisfy the following relationship:

(Pressure of carrying in-carrying out area 520)>(Pressure of washing-drying area 540)>(Pressure of process area 530)

In addition, the pressure of carrying in-carrying out area 520 is set lower than the pressure of clean room. In this manner, air flows from process area 530 to washing-drying area 540, from washing-drying area 540 to carrying in-carrying out area 520, and carrying in-carrying out area 520 to the clean room are prevented.

A loading unit 520a and an unloading unit 520b for housing substrate cassettes containing semiconductor substrates are provided in the carrying in-carrying out area 520. Washing sections 541 and drying sections 542, each one pair, are provided in the washing-drying area 540 for post treatment after the plating process. A carriage section (carriage robot) 543 to transfer semiconductor substrates is also provided in the washing-drying area 540. As the washing section 541, a pencil-type washer with a sponge at the tip or a roller-type washer with sponge can be used. As the drying section 542, a drier of the type in which semiconductor substrates are dehydrated and dried by being spun at a high speed can be employed.

In the process area 530, a pre-treatment vessel 531 for the pre-treatment of semiconductor substrate plating operation and a plating vessel 532 for copper plating operation (i.e. the plating device of the present invention, applicable to the devices for plating in the following substrate processing units), as well as a carriage section (carriage robot) 533 to transfer semiconductor substrates are provided.

Figure 2:
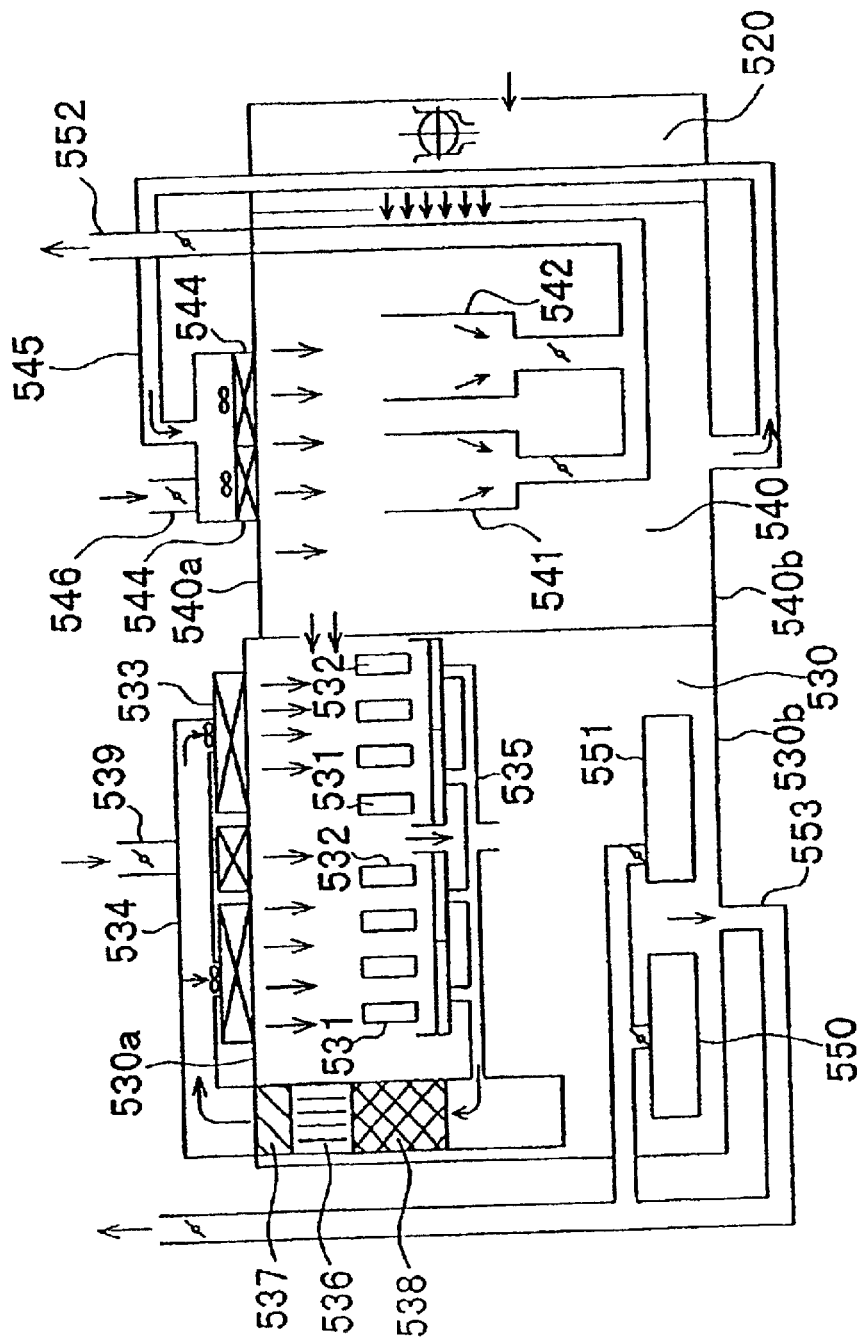
FIG. 2 is a drawing showing air flows in the substrate processing unit of FIG. 1.
Figure 3:
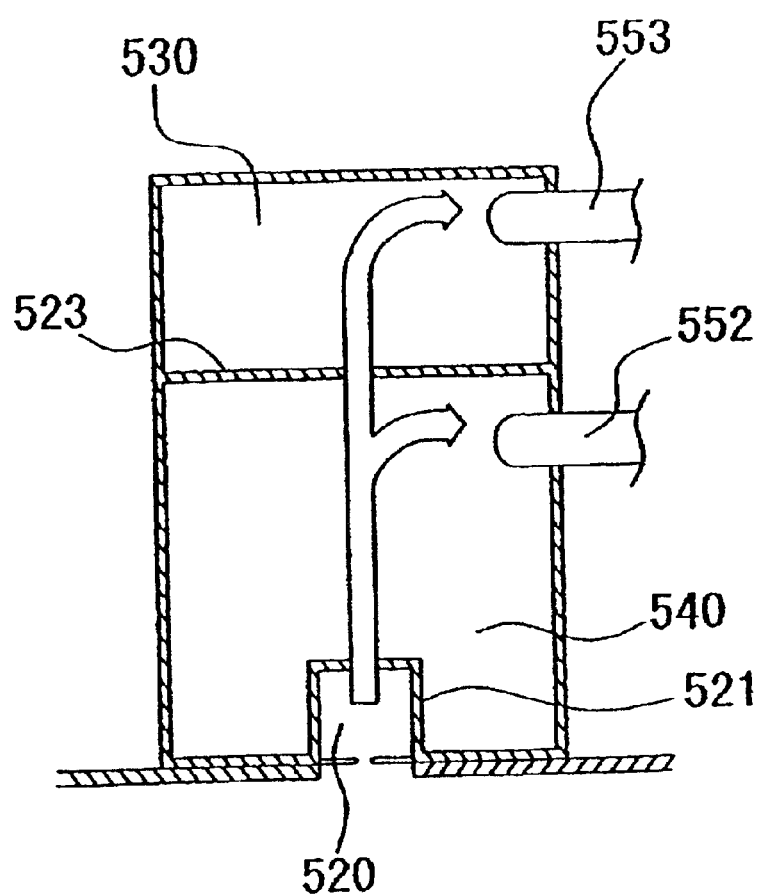
FIG. 3 is a drawing showing air flows between the areas in the substrate processing unit of FIG. 1.

FIG. 2 shows a flow of air in the substrate processing unit. In the washing-drying area 540, fresh air comes in from outside via a pipe 546, is forced to enter the unit through a high performance filter 544 by a fan, and is supplied to around a washing section 541 and a drying section 542 as a down-flowing clean air from a ceiling 540a. Most portion of the supplied clean air is returned to the ceiling 540a side from a floor 540b via a circulation pipe 545, again forced to enter the unit through the high performance filter 544 by a fan, and recycled to washing-drying area 540. Part of air flow is exhausted from the washing section 541 and drying section 542 through a conduit 552.

Although the process area 530 is a wet zone, no particles are allowed to attach to the surface of semiconductor substrates. Therefore, particles are prevented from attaching to semiconductor substrates by introducing down-flow clean air to the process area 530 from the ceiling 530a, after the air has been forced to go through a high performance filter 533 by a fan.

However, a huge amount of air must be supplied and discharged if the all amount of down-flow clean air depends on the outside source. For this reason, only the amount of air to maintain the room pressure lower than the atmospheric pressure is exhausted through the conduit 553, with a major portion of down-flow air being supplied by circulation via recycle conduits 534, 535.

Because the circulation air contains mists of liquid chemicals and gases after passing through the process area 530, the air is caused to pass through a scrubber 536 and mist separators 537, 538 to remove the mists and gases. In this manner, air free from liquid chemical mists and gases is returned to the recycle conduit 534 on the ceiling 530a side. The air is again forced by a fan to go through the high performance filter 533 and circulated to the process area 530 as clean air.

Part of air coming into the process area 530 from a floor 530b is exhausted to the outside through a conduit 553. In this manner, air containing liquid chemical mists and gases is exhausted to the outside through a conduit 553. Fresh air in an amount equivalent to the exhausted gas is supplied from the conduit 539 of the ceiling 530a to maintain the pressure in the process area 530 lower than the atmospheric pressure.

The pressures in the carrying in-carrying out area 520, the washing-drying area 540, and the process area 530 are set to satisfy the following relationship:

(Pressure of carrying in-carrying out area 520)>(Pressure of washing-drying area 540)>(Pressure of process area 530)

Therefore, when shutters 522, 524 are open, the air flows in the direction i.e. from carrying in-carrying out area 520 to washing-drying area 540, and then to process area 530. Exhaust gases are collected in an exhaust duct 554 through conduits 552, 553 as shown in FIG. 4.

Figure 4:
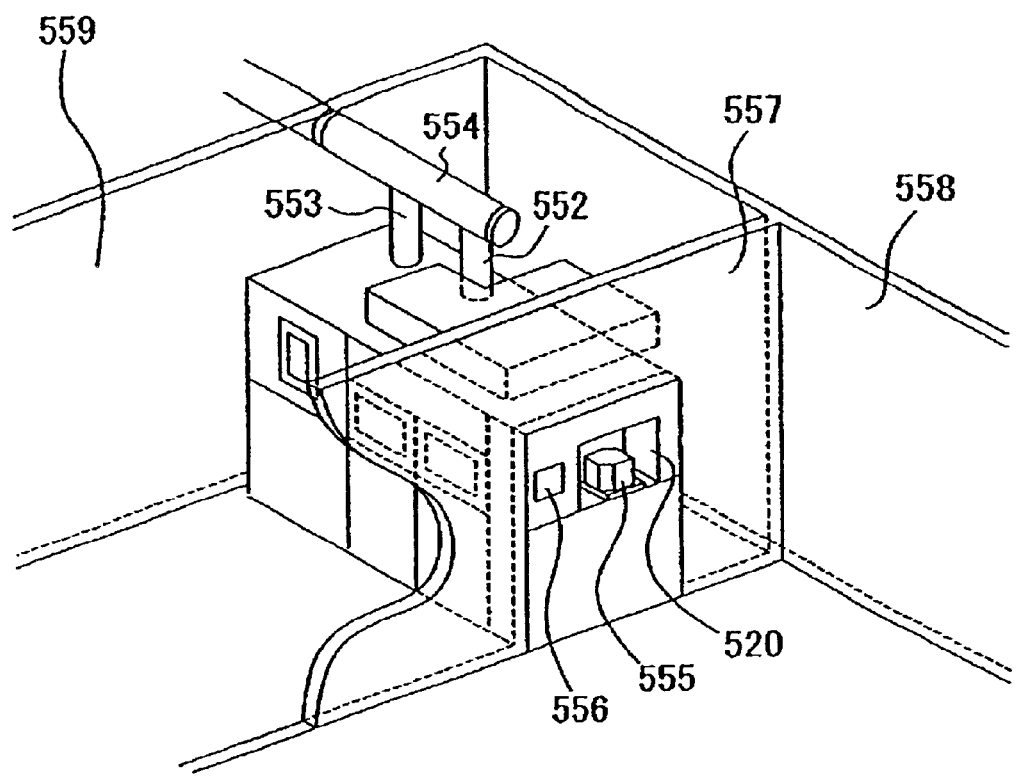
FIG. 4 shows an external view of an example in which the substrate processing unit of FIG. 1 is placed in a clean room.

FIG. 4 is an external appearance showing the substrate processing unit arranged in a clean room. A side of the carrying in-carrying out area 520 on which a cassette delivery port 555 and a control panel 556 are installed is exposed to a working zone 558 with a high degree of cleanliness, partitioned by a partition wall 557 in the clean room. The other sides are housed in a utility zone 559 with a low degree of cleanliness.

Because the washing-drying area 540 is installed between the carrying in-carrying out area 520 and the process area 530, and partition walls 521 and 523 are installed between the carrying in-carrying out area 520 and the washing-drying area 540 and between the washing-drying area 540 and the process area 530, semiconductor substrates carried into the substrate processing unit for wiring from the working zone 558 through the cassette delivery port 555 in a dry condition are processed in the substrate processing unit and, after plating, washing, and drying, carried out to the working zone 558. Therefore, no particles and mists adhere to the surface of semiconductors, and the working zone 558 with a high degree of cleanliness in the clean room is not contaminated with particles, liquid chemicals, and washing mists.

Although FIG. 1 and FIG. 2 show an example of a substrate processing unit having a carrying in-carrying out area 520, washing-drying area 540, and process area 530, it is possible to provide an area with a CMP unit in the process area 530 or adjacent to the process area 530, and to locate a washing-drying area 540 between such a process area 530 or the area with a CMP unit and carrying in-carrying out area 520. It is only necessary that the substrate processing unit for wiring semiconductor substrates can receive the semiconductor substrates in a dry condition and deliver plated semiconductor substrates in a washed and dry condition.

Although a substrate processing unit for wiring semiconductor substrates was illustrated in the above example, substrates are not limited to semiconductor substrates and parts to be processed by plating operation are not limited to wiring parts formed on the surface of the substrates.

Figure 5:
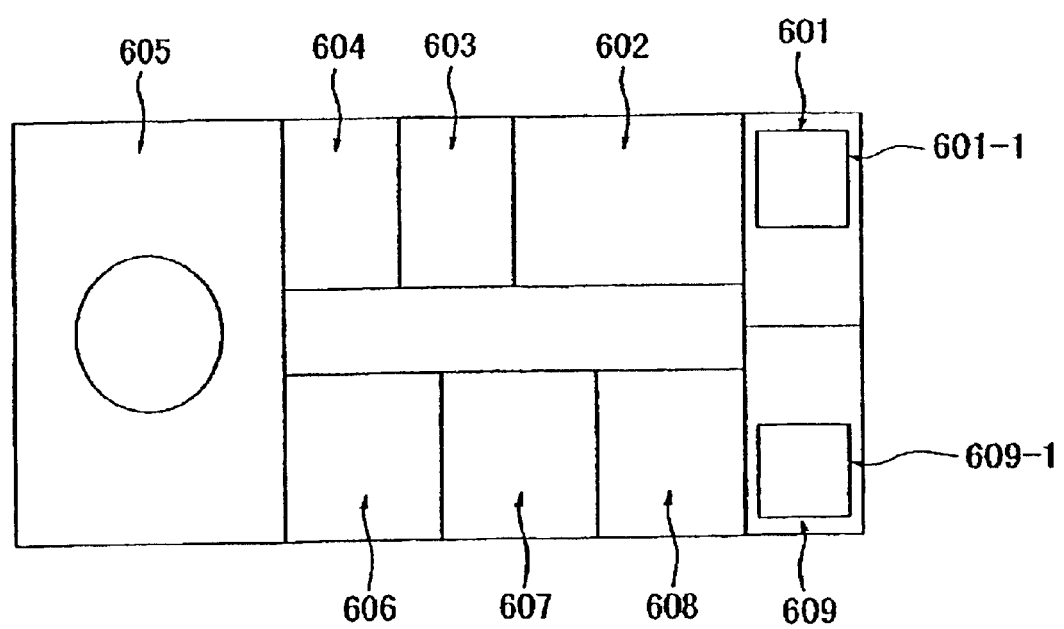
FIG. 5 is a plane arrangement diagram showing another example of the substrate processing unit.

FIG. 5 is a drawing showing a plane arrangement of another substrate processing unit for wiring semiconductor substrates. As shown in the figure, the substrate processing unit for wiring semiconductor substrates has a carrying-in section 601 for carrying in semiconductor substrates, a copper plating vessel 602 for copper plating operation, washing vessels 603, 604 for washing operation with water, a CMP section 605 for chemical mechanical polishing (CMP), washing vessels 606, 607, a drying vessel 608, and a carrying-out section 609 for delivery of semiconductor substrates on which wiring layers have been formed. A substrate transfer means (not shown) to deliver semiconductor substrates to these sections and vessels is arranged as one unit to form the substrate processing unit for wiring semiconductor substrates.

In the substrate processing unit of the above configuration, semiconductor substrates with no wiring layer formed thereon are removed from a substrate cassette 601-1 placed on the carrying-in section 601 and transferred to the copper plating vessel 602. In the copper plating vessel 602, a copper plating layer is formed on the surface of the semiconductor substrate W which contains a wiring part consisting of wiring grooves and wiring holes (contact holes).

The semiconductor substrate W on which a copper plating layer has been formed in above-mentioned copper plating vessel 602 is transferred to the water washing vessel 603 and water washing vessel 604 by a substrate transfer means to be washed with water there. After washing with water, the semiconductor substrate W is transferred to the CMP section 605 by the substrate transfer means, where the plated copper layer on the surface of the semiconductor substrate W is removed, excluding the parts in which wiring grooves and wiring holes have been formed.

Next, the semiconductor substrate W from which the unnecessary parts of the plated copper layer has been removed, excluding part of the copper layer forming a wiring part consisting of wiring grooves and wiring holes, is sent to the water washing vessel 606 and the water washing vessel 607 using a substrate transfer means, wherein the semiconductor substrate W is washed with water. The semiconductor substrate W washed with water is then dried in the drying vessel 608. The dried semiconductor substrate W is stored in the substrate cassette 609-1 of the carrying-out section 609 as a semiconductor substrate for which formation of a wiring layer has been completed.

Figure 6:
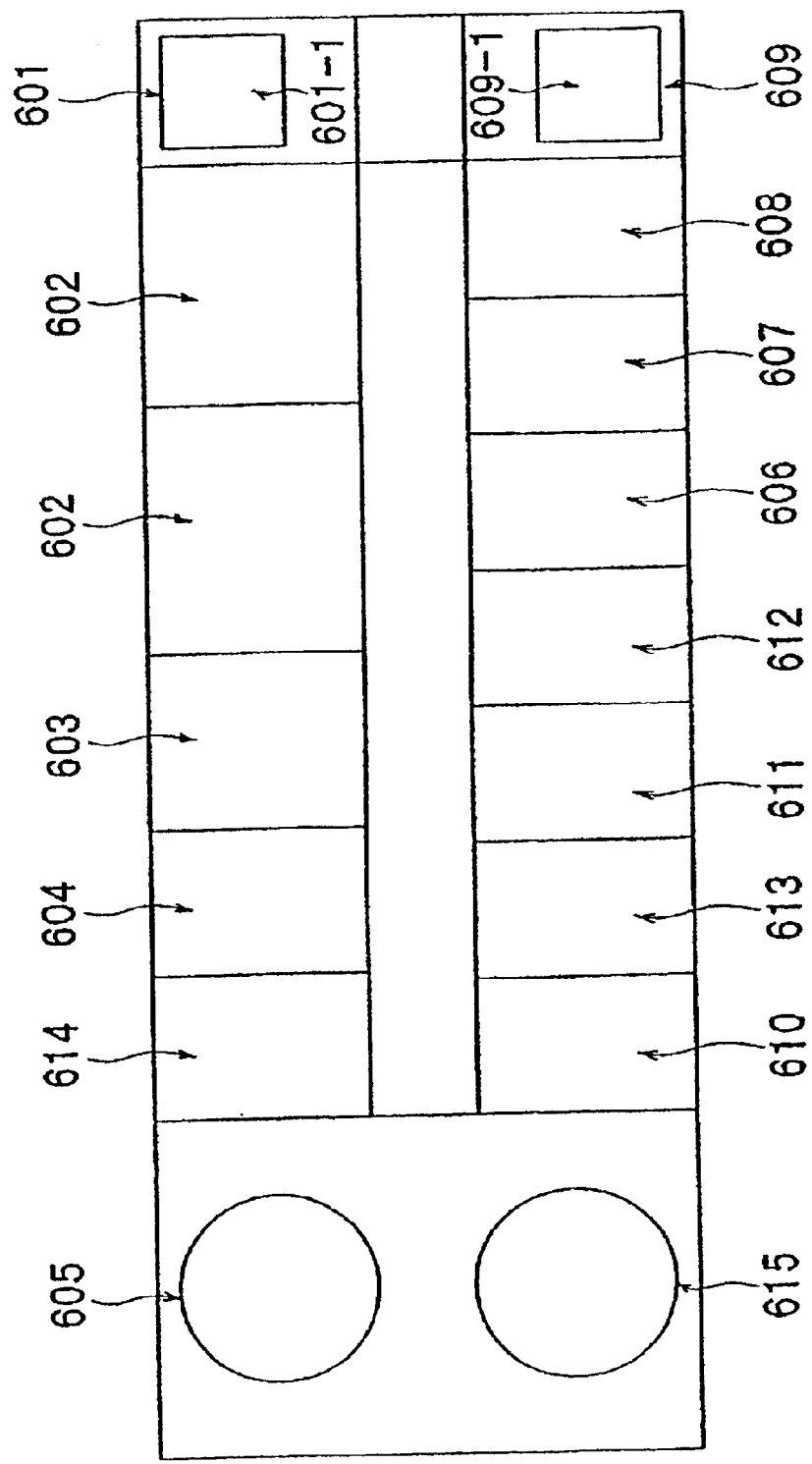
FIG. 6 is a plane arrangement diagram showing still another example of the substrate processing unit.

FIG. 6 is a drawing showing a plane arrangement of still another substrate processing unit for wiring semiconductor substrates. The substrate processing unit shown in FIG. 6 differs from the unit shown in FIG. 5 in that the unit of FIG. 6 additionally contains a copper plating vessel 602, a cover plating vessel 612 for forming a protective film on the surface of the plated copper film, a CMP section 615, and water washing vessels 613, 614, forming a unit including these additional sections and vessels.

In the substrate processing unit of the above configuration, a copper plating layer is formed on the surface of the semiconductor substrate W which contains a wiring part consisting of wiring grooves and wiring holes (contact holes). Next, in the CMP section 605 the plated copper layer on the surface of the semiconductor substrate W is removed, excluding the parts in which wiring grooves and wiring holes have been formed.

Then, the semiconductor substrate W, from which the plated copper layer excluding the parts in which wiring grooves and wiring holes are formed has been removed, is sent to the water washing vessel 610, where the semiconductor substrate W is washed with water. The substrate W is then treated in a pretreating vessel 611 for the pretreatment for cover plating mentioned later. The pre-treated semiconductor substrate W is sent to the cover plating vessel 612, in which a protective film is formed on the surface of the plated copper layer forming a wiring part. An Ni—B electroless plating vessel, for example, is used for forming a protective film. After forming the protective film, the semiconductor substrate W is washed with water in the water washing vessels 606, 607, and dried in the drying vessel 608.

Then, the surface of the protective film formed on the copper plating layer is ground and flattened in the CMP section 615. After washing with water in the water washing vessels 613, 614 and drying in the drying vessel 608, the semiconductor substrate W is stored in the substrate cassette 609-1 in the carrying-out section 609.

Figure 7:
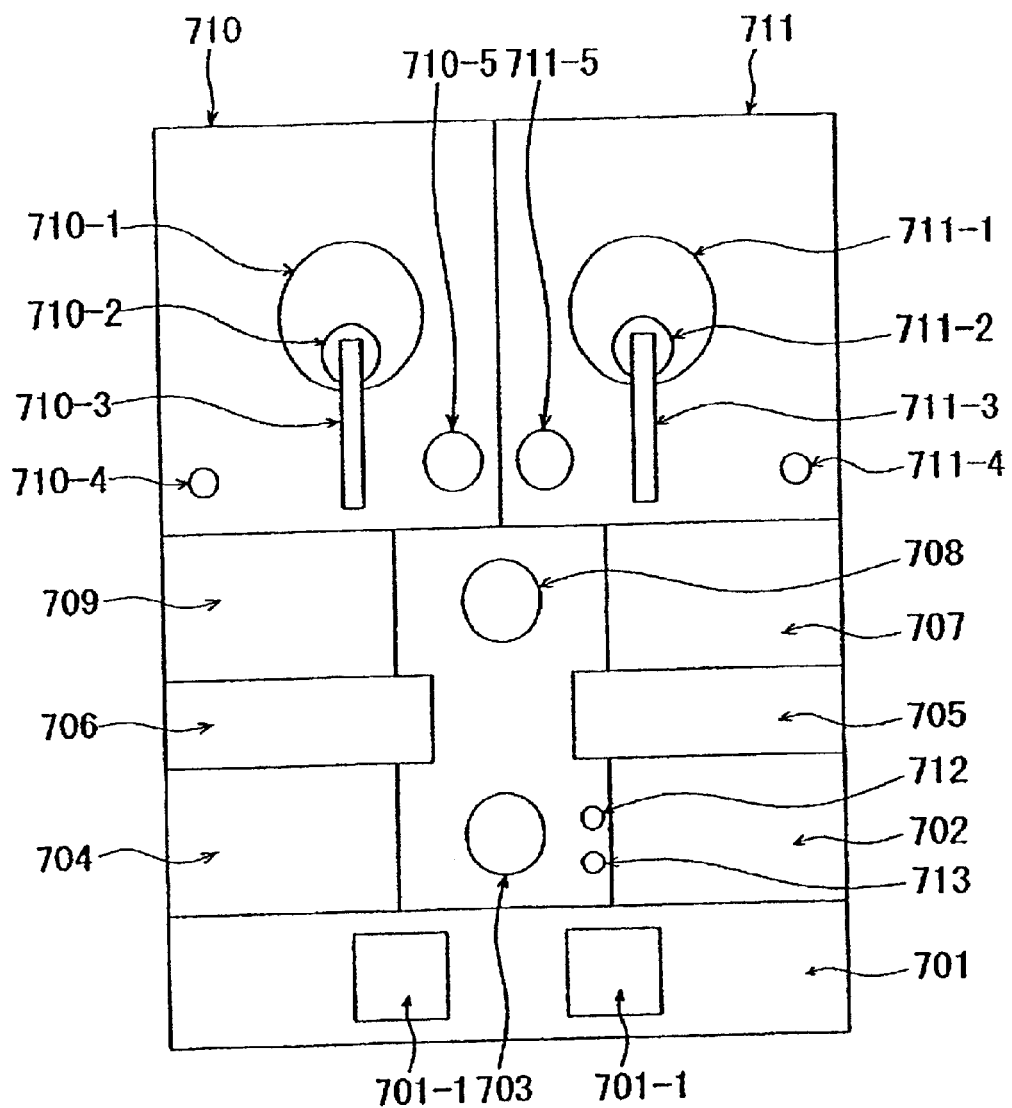
FIG. 7 is a plane arrangement diagram showing a further example of the substrate processing unit.

FIG. 7 is a plane arrangement showing still another substrate processing unit. This semiconductor substrate processing unit has a loading-unloading section 701, copper plating unit 702, first robot 703, third washer 704, inverter 705, inverter 706, second washer 707, second robot 708, first washer 709, first polishing machine 710, and second polishing machine 711. A plating thickness measuring device 712 for measuring the thickness before and after plating and a thickness measuring device 713 for measuring the thickness of dry semiconductor substrate W after polishing are installed in the neighborhood of the first robot 703.

The first polishing machine 710 (grinding unit) is equipped with a grinding table 710-1, top ring 710-2, top ring head 710-3, film thickness measurement device 710-4, and pusher 710-5. The second polishing machine 711 (grinding unit) is equipped with a grinding table 711-1, top ring 711-2, top ring head 711-3, film thickness measurement device 711-4, and pusher 711-5.

A cassette 701-1 containing a semiconductor substrate W on which contact holes and wiring grooves have been formed is placed on a loading port of the loading-unloading section 701. The first robot 703 removes the semiconductor substrate W from the cassette 701-1 and sends it to the copper plating unit 702 for forming a copper plating film. In this instance, the thickness of the seed layer is measured by the plating thickness measuring device 712 for measuring the thickness before and after plating. The copper plating operation consists of a hydrophilic processing of the surface of the semiconductor substrate W, followed by formation of copper film. After formation of a copper plating film, the substrate is rinsed or washed in the copper plating unit 702. The semiconductor substrate W may be dried if there is time to spare.

When the semiconductor substrate W is removed from the unit 702 using the first robot 703, the thickness of the plated copper film is measured by the plating thickness measuring device 712 for measuring the thickness before and after plating. The result of measurement is recorded as recording data of the semiconductor substrate in the recording device (not shown) and also used for judgment of abnormalities of the copper plating unit 702. After the thickness measurement, the first robot 703 delivers the semiconductor substrate W to the inverter 705, by which the semiconductor substrate W is inverted so that the surface plated with copper faces downward. Either a series mode or parallel mode is applicable to a grinding operation by the first polishing machine 710 and second polishing machine 711. A series mode grinding operation is described below.

The series mode grinding operation consists of primary grinding by the first polishing machine 710 and secondary grinding by the second polishing machine 711. The second robot 708 picks up the semiconductor substrate W from the inverter 705 and puts it on a pusher 710-5 of the polishing machine 710. The top ring 710-2 adsorbs the semiconductor substrate W on the pusher 710-5 and causes the surface of the semiconductor substrate W to be plated with copper to come into contact with and be pressed to the grinding surface of the grinding table 710-1, whereby first grinding is performed. The plated copper film is substantially ground in the first grinding. The grinding surface of the grinding table 710-1 is made of a foaming polyurethane pad such as IC1000 or a material with abrasive particles immobilized or impregnated therein. The plated copper film is ground by a relative movement of the grinding surface and semiconductor substrate W.

After grinding the plated copper film, the semiconductor substrate W is returned onto the pusher 710-5 using the top ring 710-2. The second robot 708 picks up the semiconductor substrate W and puts it into the first washer 709. In this instance, a liquid chemical agent may be sprayed onto the surface or back of the semiconductor substrate W on the pusher 710-5 to remove particles or render the particles less attachable.

After washing using the first washer 709, the second robot 708 picks up the semiconductor substrate W and put it on a pusher 711-5 of the second polishing machine 711. The top ring 711-2 then adsorbs the semiconductor substrate W on the pusher 711-5 and causes the surface of the semiconductor substrate W with a barrier layer formed thereon to come into contact with and be pressed to the grinding surface of the grinding table 711-1, whereby second grinding is performed. The barrier layer is ground in the second grinding. In some case, a copper film and an oxide film which have not been ground in the primary grinding operation are also ground.

The grinding surface of the grinding table 711-1 is made of a foaming polyurethane pad such as IC1000 or a material with abrasive particles immobilized or impregnated therein. The surface is ground by a relative movement of the grinding surface and semiconductor substrate W. In this instance, silica, alumina, ceria, and the like may be used as abrasive particles or a slurry. The liquid chemical agent is adjusted according to the type of film.

The termination of the second grinding operation is detected by measuring the film thickness of the barrier layer using an optical-type film thickness measuring device (the operation is terminated when the thickness becomes zero) or may be determined by means of surface detection of an insulating layer consisting of $SiO_2$. A film thickness measuring device 711-4 with an image processing function may be installed near the grinding table 711-1 to measure the thickness of the oxide film. The results are stored as processing records of the semiconductor substrate W or used for judgment as to whether or not the semiconductor substrate W after the secondary grinding may be transferred to the next step. When a semiconductor substrate W is found to have not reached the termination point of the secondary grinding, the substrate may be ground again. If the semiconductor substrate W is found to have been ground beyond a prescribed value for any abnormalities, the grinding operation of the substrate processing unit is suspended to prevent the number of rejected products from increasing.

After the secondary grinding operation, the semiconductor substrate W is transferred to the pusher 711-5 using the top ring 711-2. The semiconductor substrate W on the pusher 711-5 is picked up using the second robot 708. In this instance, a liquid chemical agent may be sprayed onto the surface or back of the semiconductor substrate W on the pusher 711-5 to remove particles or render the particles less attachable.

The second robot 708 sends the semiconductor substrate W to the second washer 707, in which the semiconductor substrate W is washed. The second washer 707 has the same configuration as the first washer 709. The surface of the semiconductor substrate W is washed by scrubbing using a PVA sponge roll in a washing solution prepared by adding a surfactant, chelating agent, and pH adjusting agent to purified water to remove particles. The back of the semiconductor substrate W is treated with a strong chemical solution such as DHF injected from nozzles to etch diffused copper. If there is no problem of copper diffusion, the back may be washed by scrubbing with a PVA sponge roll using the same chemical solution as used for washing the surface.

After the washing operation, the second robot 708 picks up the semiconductor substrate W and send it to the inverter 706, which inverts the semiconductor substrate W. The first robot 703 then picks up the inverted semiconductor substrate W and puts it into the third washer 704. In the third washer 704, mega-sonic water excited by supersonic wave vibration is projected onto the surface of the semiconductor substrate W to wash the semiconductor substrate W. Alternatively, the surface of the semiconductor substrate W may be washed with a known pencil-type sponge using a washing solution prepared by adding a surfactant, chelating agent, and pH adjusting agent to purified water. The semiconductor substrate W is then dried by spin-drying.

When the film thickness is measured using the thickness measuring device 711-4 installed in the neighborhood of the grinding table 711-1, the semiconductor substrate W is housed as is in the cassette placed on an unloading port of the loading-unloading section 701.

Figure 8:
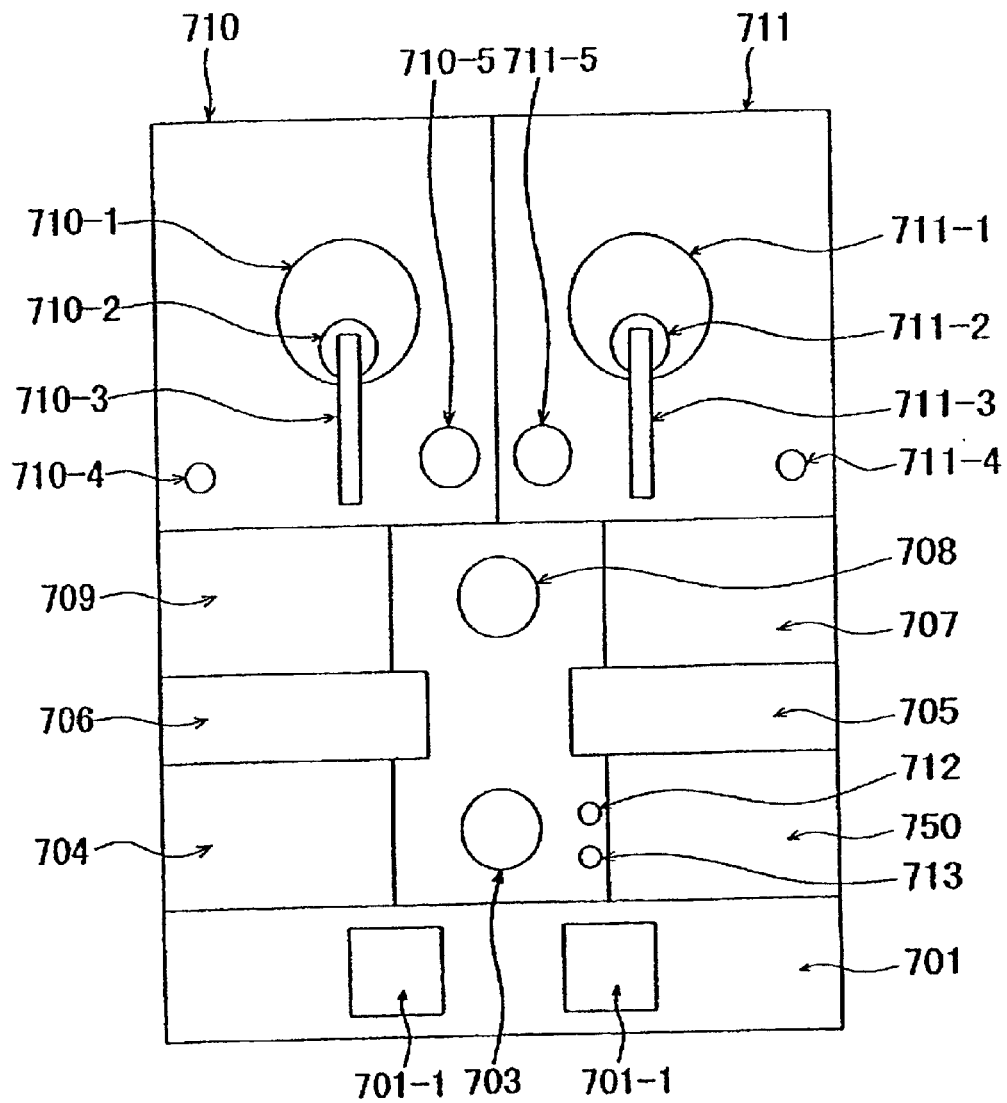
FIG. 8 is a plane arrangement diagram showing a still further example of the substrate processing unit.

FIG. 8 shows a plane arrangement of still another substrate processing unit. This substrate processing unit differs from the substrate processing unit shown in FIG. 7 in that it is provided with a cover plating unit 750 instead of the copper plating unit 702 shown in FIG. 7.

The cassette 701-1 containing the semiconductor substrate W with plated copper film is placed on the loading-unloading section 701. The semiconductor substrate W is removed from the cassette 701-1 and sent to the first polishing machine 710 or the second polishing machine 711, wherein the surface of the copper film is ground. After grinding, the semiconductor substrate W is sent to the first washer 709, in which the semiconductor substrate W is washed.

The semiconductor substrate W washed in the first washer 709 is sent to the cover plating unit 750, in which a protective film is formed over the surface of the plated copper film to prevent the latter from being oxidized in the atmosphere. The semiconductor substrate W covered with a protective film is sent from the cover plating unit 750 to the second washer 707 by the second robot 708, wherein the semiconductor substrate W is washed with purified water or deionized water. After washing, the semiconductor substrate W is returned to the cassette 701-1 placed on the loading-unloading section 701.

Figure 9:
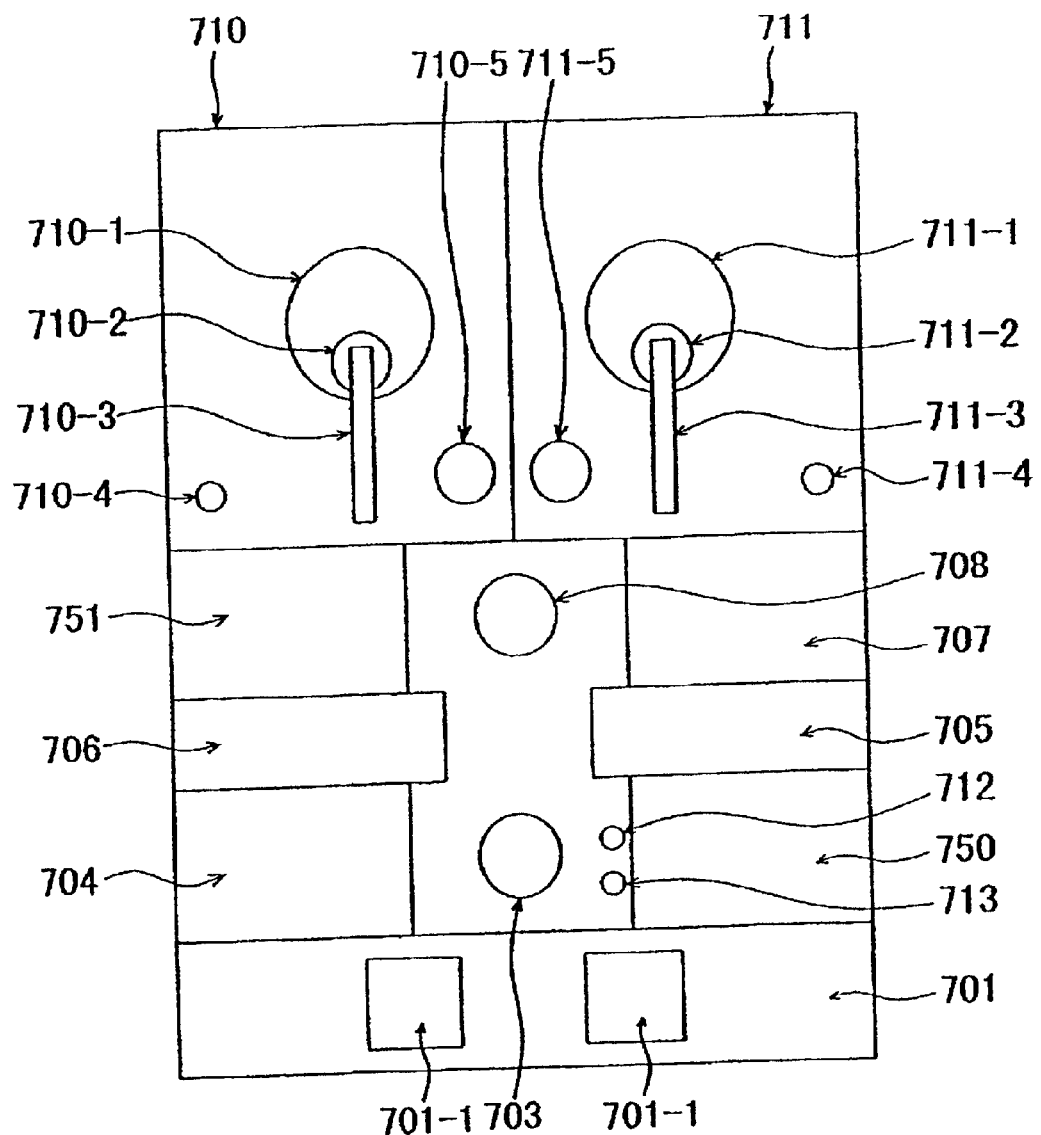
FIG. 9 is a plane arrangement diagram showing a still further example of the substrate processing unit.

FIG. 9 shows a plane arrangement of still another substrate processing unit. This substrate processing unit differs from the substrate processing unit shown in FIG. 8 in that it is provided with an annealing plating unit 751 instead of the first washer 709 shown in FIG. 8.

The semiconductor substrate W ground by the first polishing machine 710 or the second polishing machine 711 and washed in the second washer 707 is sent to the cover plating unit 750, in which a protective film is formed over the surface of the plated copper film. The semiconductor substrate W covered with a protective film is sent from the cover plating unit 750 to the third washer 704 by the first robot 703, wherein the semiconductor substrate W is washed.

The semiconductor substrate W washed in the third washer 704 is sent to the annealing unit 751, in which the semiconductor substrate W is annealed. Annealing converts the plated copper into an alloy and increases the electron migration resistance. The annealed semiconductor substrate W is sent from the annealing unit 751 to the second washer 707, wherein it is washed with purified water or deionized water. After washing, the semiconductor substrate W is returned to the cassette 701-1 placed on the loading-unloading section 701.

Figure 10:
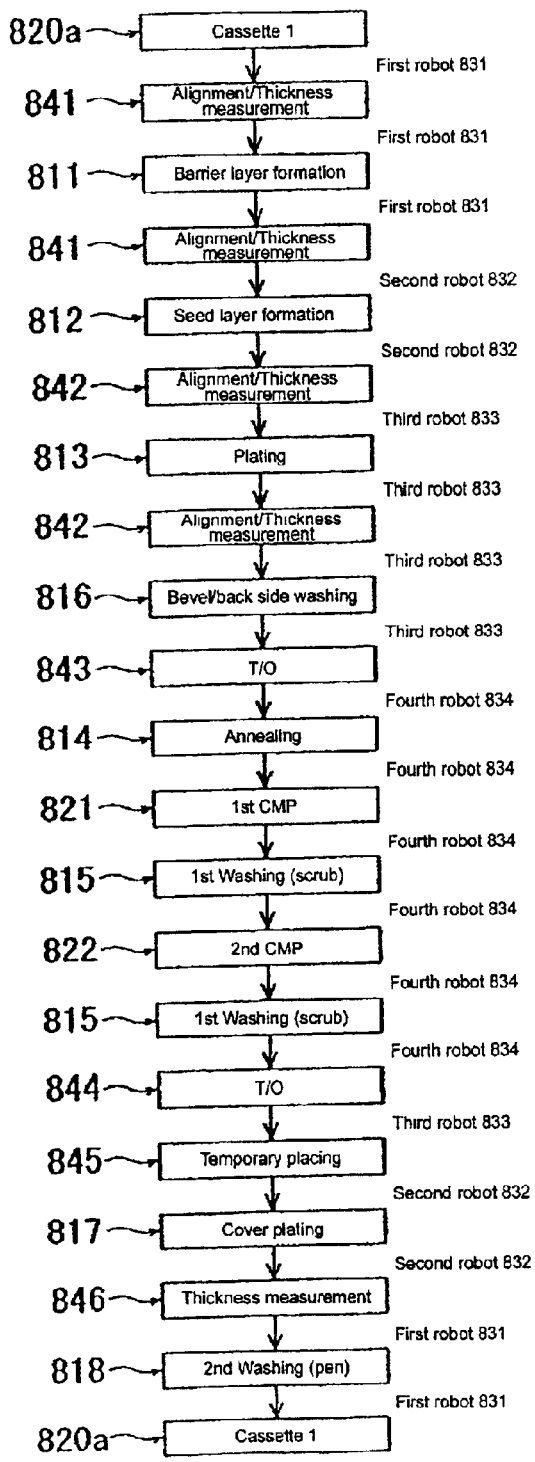
FIG. 10 is a flow chart showing a process flow of the substrate processing unit using the plating method of the present invention.

FIG. 10 is a flow chart showing a process flow in the substrate processing unit. Each step in the unit will now be described in accordance with the flow chart. The semiconductor substrate W removed from a cassette 820$a$ which is placed on a loading-unloading unit 820 (not shown) by a first robot 831 (FIG. 10) is placed in a first aligner-thickness measurer 841 with the surface to be plated facing up. In this instance, to determine the standard point of positioning for film thickness measurement, notches for the thickness measurement are aligned before acquiring the film thickness data for the semiconductor substrate before plating the copper film.

The semiconductor substrate W is then sent to a barrier layer forming unit 811 by the first robot 831. The barrier layer forming unit 811 is a unit for forming a barrier layer on the semiconductor substrate by electroless Ru plating. An Ru film is formed as a film for preventing copper from diffusing into an interlayer dielectric (for example, a film made from $SiO_2$) of the semi-conductor device. The semiconductor substrate forwarded from washing and drying steps is sent to the first aligner-thickness measurer 841 by the first robot 831, wherein the thickness of the semiconductor substrate, i.e. the thickness of the barrier layer, is measured.

After the thickness measurement, the second robot 832 (FIG. 10) delivers the semiconductor substrate to a seed layer forming unit 812, in which a seed layer is formed on the barrier layer by electroless copper plating. The semiconductor substrate forwarded from the washing and drying steps is sent to a second aligner-thickness measurer 842 by a second robot 832 before being delivered to an impregnation plating unit 813. Notches for copper plating are aligned by the second aligner-thickness measurer 842. In this instance, if required, the film thickness of the semiconductor substrate before copper plating may again be measured.

After the notch alignment, the semiconductor substrate is sent to a plating unit 813 by a third robot 833 (FIG. 10) for copper plating. The semiconductor substrate forwarded from the washing and drying steps is sent to a bevel/back washing unit 816 by the third robot 833 for removing unnecessary copper film (seed layer) at the ends of the semiconductor substrate. In the bevel/back washing unit 816, the bevel is etched and copper adhering to the back of the semiconductor substrate is washed out using a chemical solution such as hydrofluoric acid within a previously specified period of time. In this instance, before forwarding the semiconductor substrate to the bevel/back washing unit 816, the film thickness of the semiconductor substrate is measured by the second aligner-thickness measurer 842 (not shown). The etching time for the bevel may be arbitrarily varied according to the resulting copper film thickness formed by plating. The area to be etched by the bevel etching is the circumference of the substrate, wherein circuits are not formed, or formed circuits, if any, are not utilized as a chip. A bevel section is included in this area.

The semiconductor substrate forwarded from the bevel/back washing unit 816 after washing and drying is sent to a substrate inversion machine 843 by the third robot 833, and inverted so that the plating surface faces downward, following which it is sent to an annealing unit 814 by a fourth robot 834 (FIG. 10) to stabilize wiring. Prior to and/or following the annealing process, the semiconductor substrate is sent to the second aligner-thickness measurer 842 to measure the thickness of the copper film formed on the semiconductor substrate. Thereafter, the semiconductor substrate is sent to the first polishing machine 821 by the fourth robot 834, wherein the copper and seed layers are ground.

Any optional abrasive particles may be used for grinding, including stationary abrasive particles which ensure a flat surface, preventing the surface from becoming like a dish. After completion of grinding in the first polishing machine, the semiconductor substrate is sent to a first washing unit 815 by the fourth robot 834, where the semiconductor substrate is washed. In the washing operation, a roll with approximately the same length as the diameter of the semiconductor substrate is placed on both sides (surface and back) of the semiconductor substrate. The semiconductor substrate is washed by scrubbing while rotating both the semiconductor substrate and the rolls and injecting purified water or deionized water.

After completion of the first washing, the semiconductor substrate is sent to the second polishing machine 822 by the fourth robot 834 to grind the barrier layer formed on the semiconductor substrate. Any optional abrasive particles may be used for the grinding, including stationary abrasive particles which ensure a flat surface, preventing the surface from becoming like a dish. After completion of grinding in the second polishing machine, the semiconductor substrate is again forwarded to the first washing unit 815 by the fourth robot 834 to wash the semiconductor substrate by scrubbing. After washing, the semiconductor substrate is forwarded to a second substrate inverter 844 by the fourth robot 834 and reversed to cause the plating surface to face upward, then placed on a temporary substrate table 845 by the third robot 833.

The semiconductor substrate is sent from the temporary substrate table 845 to a cover plating unit 817 by the second robot 832 to plate nickel-boron on the copper surface to prevent copper from being oxidized in the atmosphere. The semiconductor substrate covered with a protective film is sent from the cover plating unit 817 to a third film thickness measurer 846 by the second robot 832 to measure the copper film thickness. Then, the semiconductor substrate is forwarded to the second washing unit 818 by the first robot 831 to wash the semiconductor substrate with purified water or deionized water. After washing, the semiconductor substrate is returned to the cassette 820 a placed on the loading-unloading section 820 by the first robot 831.

Figure 11:
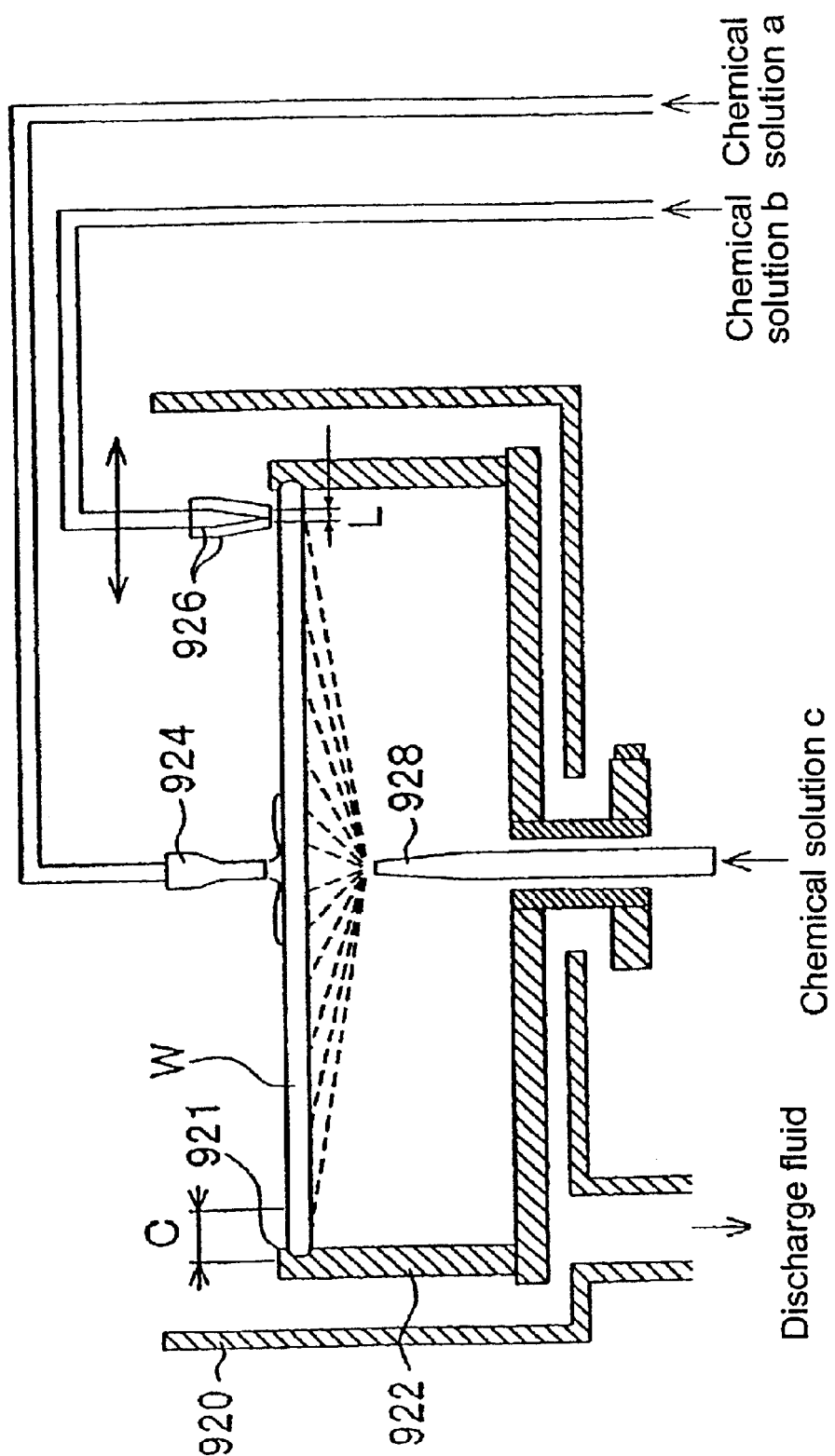
FIG. 11 is a drawing showing an outline of a bevel/back washing unit.

The aligner-thickness measurer 841 and aligner-thickness measurer 842 determine positions for the substrate notches and measure the film thickness. In the bevel/back washing unit 816, copper is etched from the edges (bevels) and the back is washed at the same time. In addition, it is possible to control the growth of a naturally oxidized copper film in the circuit portions on the surface of the semiconductor substrate. FIG. 11 is a drawing showing an outline of a bevel/back washing unit 816. As shown in FIG. 11, the bevel/back washing unit 816 is provided with a substrate holding section 922, located in a cylindrical waterproof cover with a bottom 920, to horizontally hold the substrate W and cause it to rotate at a high speed, with the upper surface of the substrate W facing upward using a plurality of spin chucks 921 provided around the periphery of the cylinder, a center nozzle 924 provided above the substrate W held by the substrate holding section 922 in almost the center of the surface side of the substrate W, and an edge nozzle 926 provided over the periphery of the substrate W. The center nozzle 924 and edge nozzle 926 are provided with the nozzles facing downward. Also provided under the back of the substrate W near the center is a back nozzle 928 with the nozzle facing upward. The edge nozzle 926 is configured to be freely movable horizontally and vertically with respect to the substrate W.

The edge nozzle 926 can be arbitrarily positioned at any location from the circumference to the center of the substrate, and its movable length L can be determined according to the size of the substrate W and the purpose of use. Usually, an edge cut width C in the range of 2–5 mm is set. Plated copper film within the set cut width can be removed inasmuch as the rotation is above the limit, under which the amount of liquid leaking from the back to the surface causes problems.

The method of washing using this washing unit will now be described. First, the semiconductor substrate W horizontally maintained by the substrate holding section 922 via the spin chuck 921 is rotated horizontally together with the substrate holding section 922. In this condition, an acidic solution is supplied to the surface of the substrate W near the center thereof from the center nozzle 924. As an acidic solution, any solution of a non-oxidizing acid can be used. Examples include hydrofluoric acid, hydrochloric acid, sulfuric acid, citric acid, oxalic acid, and the like. On the other hand, an oxidative agent solution is continuously or intermittently supplied to the circumference of the substrate W from the edge nozzle 926. As the oxidative agent solution, ozone water, hydrogen peroxide solution, nitric acid solution, sodium hypochlorite solution, or any combination of these can be used.

A copper film or the like formed on the upper side and edges in the area of the edge cut width C around the periphery of the semiconductor substrate W is rapidly oxidized by the oxidizing agent solution, and at the same time, is etched and removed by being dissolved by the acid solution supplied from the center nozzle 924 and spread over the entire surface by this operation. Mixing the oxidizing agent solution and acid solution in the periphery of the substrate in this manner can produce an etching profile steeper than the profile obtained when a previously mixed solution is supplied. The etching rate of copper is determined according to the concentrations of the solutions used. Any naturally oxidized film of copper formed in the circuit forming area on the surface of the substrate is promptly removed by the acid solution spread over the entire surface by the rotation of the substrate. Therefore, such an oxidized film of copper will not accumulate. After the supply of the acid solution from the center nozzle 924 is terminated, adhesion of copper can be controlled by oxidizing silicon exposed on the surface by terminating the supply of the oxidizing agent solution from the edge nozzle 926.

On the other hand, an oxidizing agent solution and a silicon oxide film etching solution are concurrently or alternately supplied to the center of the back of the substrate from the back nozzle 928. Metallic copper and the like attached to the back of the semiconductor substrate W are oxidized together with silicon of the substrate by the oxidizing agent solution, and etched for removal using a silicon oxide film etching solution. To decrease the number of chemicals used in the process, the same solution as the oxidizing agent solution supplied to the surface can be preferably used as the oxidizing agent solution. Hydrofluoric acid can be used as the silicon oxide film etching solution. In this instance, the use of hydrofluoric acid also as the acid solution to be supplied to the surface is preferable in view of decreasing the number of chemicals used. If supply of the oxidizing agent is suspended first, a hydrophobic surface can be obtained; if supply of the etching agent solution is suspended first, a hydrophilic surface can be obtained. The back side may be conditioned in this manner according to the requirements in the later process.

In this manner, after removing metal ions remaining on the surface of the substrate W by supplying an acid solution (an etching solution) to the substrate, purified water is supplied to replace the etching solution with purified water, thereby removing the etching solution. A spin drying operation is performed thereafter. Copper film removal in the area of the edge cut width C around the periphery on the surface of the semiconductor substrate and copper contaminant removal on the back can be simultaneously carried out in this manner within a short period of time, within 80 seconds, for example. The time required for etching does not depend on the cut width of the edges, although it is possible to cut the edge with an optional width within the range of 2–5 mm.

An annealing step after plating and before the CMP step is effective for the CMP processing and electric characteristics of the wiring. When the surface of wide wiring (several microns) after the CMP processing without annealing was observed, a number of defects similar to micro-voids was observed and the electric resistance of the entire wiring was increased. The increase in the electric resistance was improved by annealing. Based on the fact that no voids were seen in thin wiring processed without annealing, the degree of grain growth is thought to be related to the annealing. Specifically, although grains are difficult to grow in thin wiring, wide wiring may allow growth of grains. During the course of growth of grains in the annealing process, very minute pores which are difficult to observe even by an SEM (scanning electron microscope) are believed to move upwardly while flocculating, producing recesses for micro voids on the surface of the wires. As for annealing conditions in the annealing unit, the above desired effect was obtained when anneal was carried out for 1–5 minutes at about 300–400° C. in the atmosphere in which 2% or less hydrogen was added.

Figure 12:
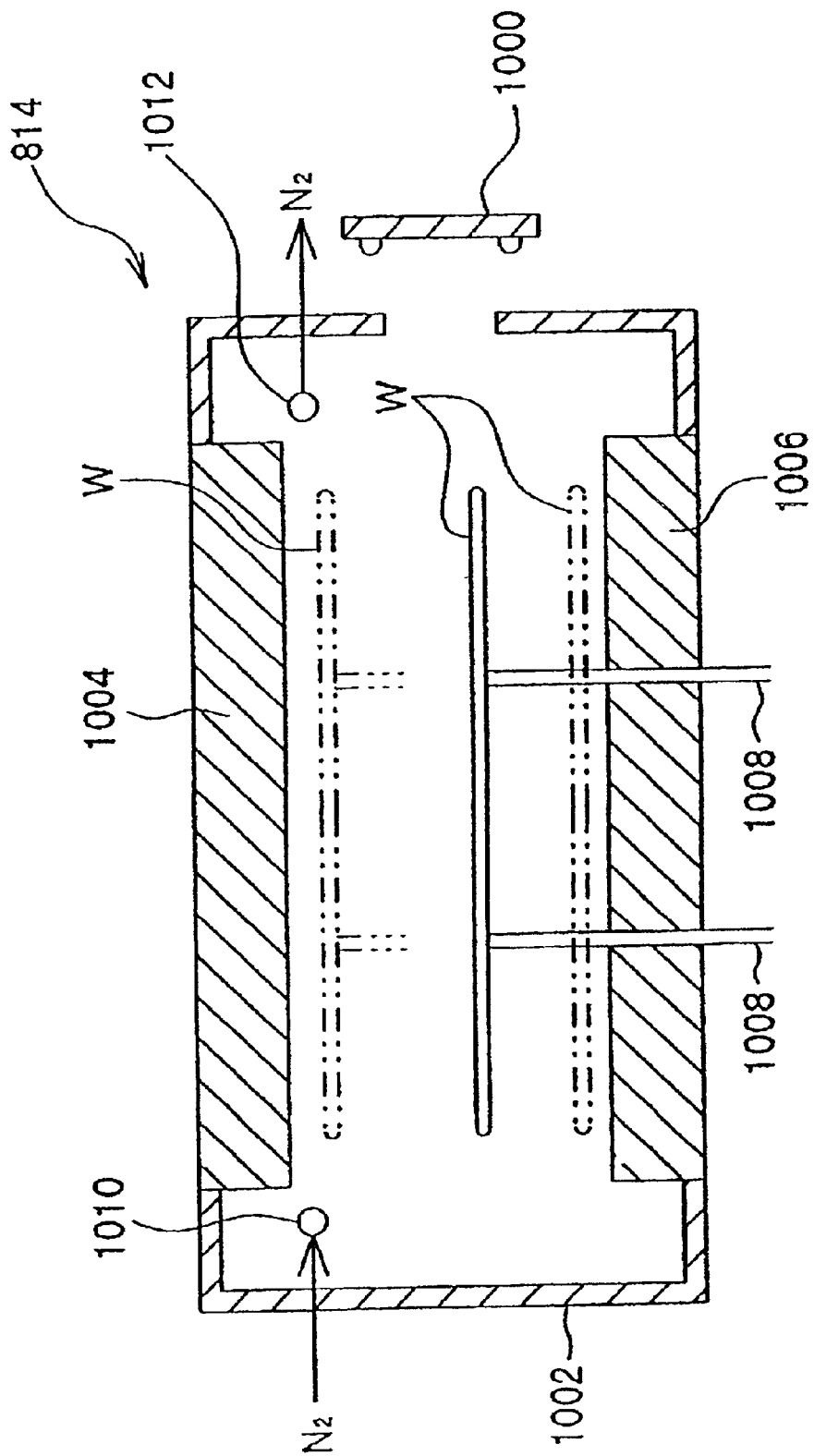
FIG. 12 is a lengthwise sectional front view showing an example of an annealing unit.
Figure 13:
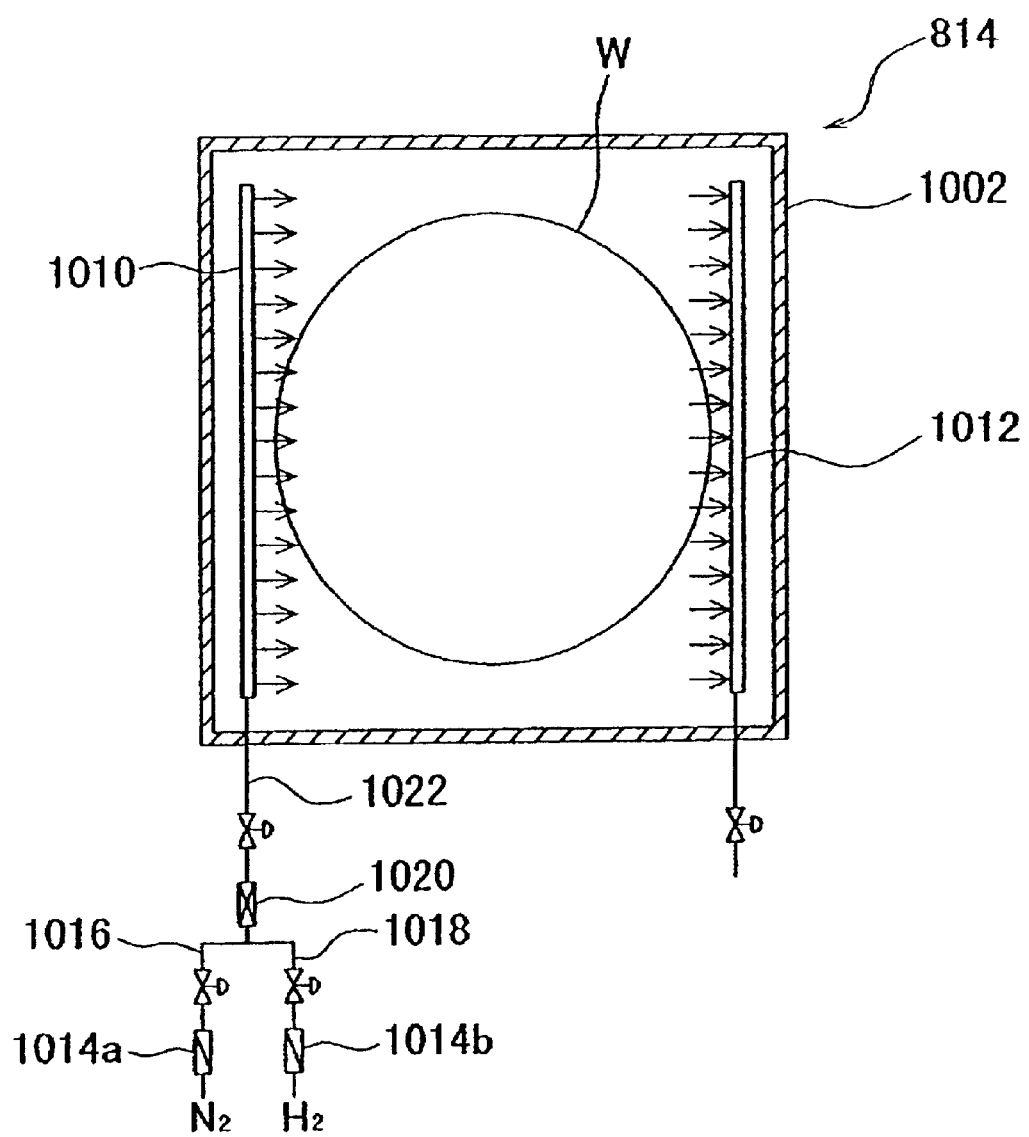
FIG. 13 is a plane cross section of FIG. 12.
Figure 14:
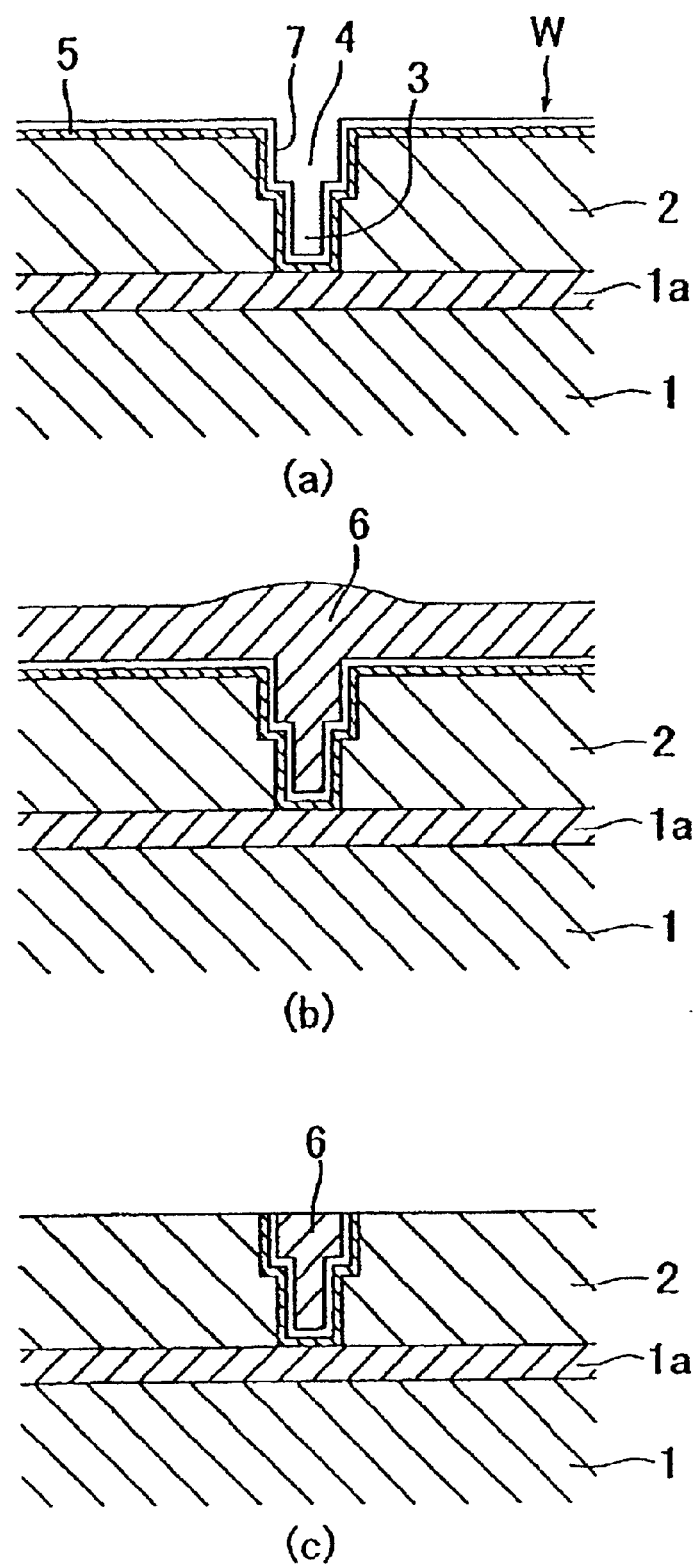
FIG. 14 shows an example of a process of forming copper wiring by copper plating.

FIGS. 12 and 13 show an annealing unit 814. This annealing unit 814 has a hot plate 1004 for heating the semiconductor substrate W to 400° C., for example, in the upper side of a chamber 1002 having a gate 1000 for inserting and removing a semiconductor substrate W, and a cooling plate 1006 for cooling the semiconductor substrate W by a stream of cooling water, for example, which is provided in the lower side of the chamber 1002. In addition, a plurality of elevating pins 1008 for holding the semiconductor substrate W on the top are vertically movably provided penetrating the cooling plate 1006. Furthermore, a pipe 1010 for introducing a gas for preventing oxidation between the semiconductor substrate W and the hot plate 1004 during annealing and a pipe 1012 for exhausting the gas which has been introduced through the 1010 and flows through the space between the semiconductor substrate W and the hot plate 1004 are provided in locations facing each other with the hot plate 1004 located between them.

$N_2$ gas flowing through an $N_2$ gas introduction conduit 1016 having a filter 1014a therein and $H_2$ gas flowing through a $H_2$ gas introduction conduit 1018 having a filter 1014b therein are mixed in a mixer 1020. The pipe 1010 for introducing gas is connected to a mixed gas introduction conduit 1022 through which the gases mixed in the mixer 1020 flow.

This configuration allows the semiconductor substrate W carried into the chamber 1002 via the gate 1000 to be held by the elevating pin 1008 and causes the elevating pin 1008 to rise to increase the distance between the semiconductor substrate W held by the elevating pin 1008 and the hot plate 1004 to, for example, about 0.1–1.0 mm. In this condition, the semiconductor substrate W is heated through the hot plate 1004 to 400° C., for example, and, at the same time, an oxidation preventing gas is introduced from the gas introduction pipe 1010, caused to flow between the semiconductor substrate W and the hot plate 1004, and exhausted from the gas exhaust pipe 1012. In this manner, the semiconductor substrate W is annealed without being oxidized. The annealing operation is carried out for about several tens of seconds to 60 seconds, for example, before completion of annealing. A heating temperature for the substrate is selected from the range of 100–600° C.

After the completion of annealing, the elevating pin 1008 is lowered to decrease the distance between the semiconductor substrate W held by the elevating pin 1008 and the cooling plate 1006 to 0–0.5 mm, for example. Then, the semiconductor substrate W is cooled to 100° C. or lower by introducing cooling water to the cooling plate 1006 for about 10–60 seconds, for example. The cooled semiconductor substrate W is delivered to the next step.

Although a mixed gas of $N_2$ gas and several percent of $H_2$ gas is used as the gas for preventing oxidation in this example, $N_2$ gas alone may be used.

Figure 15:
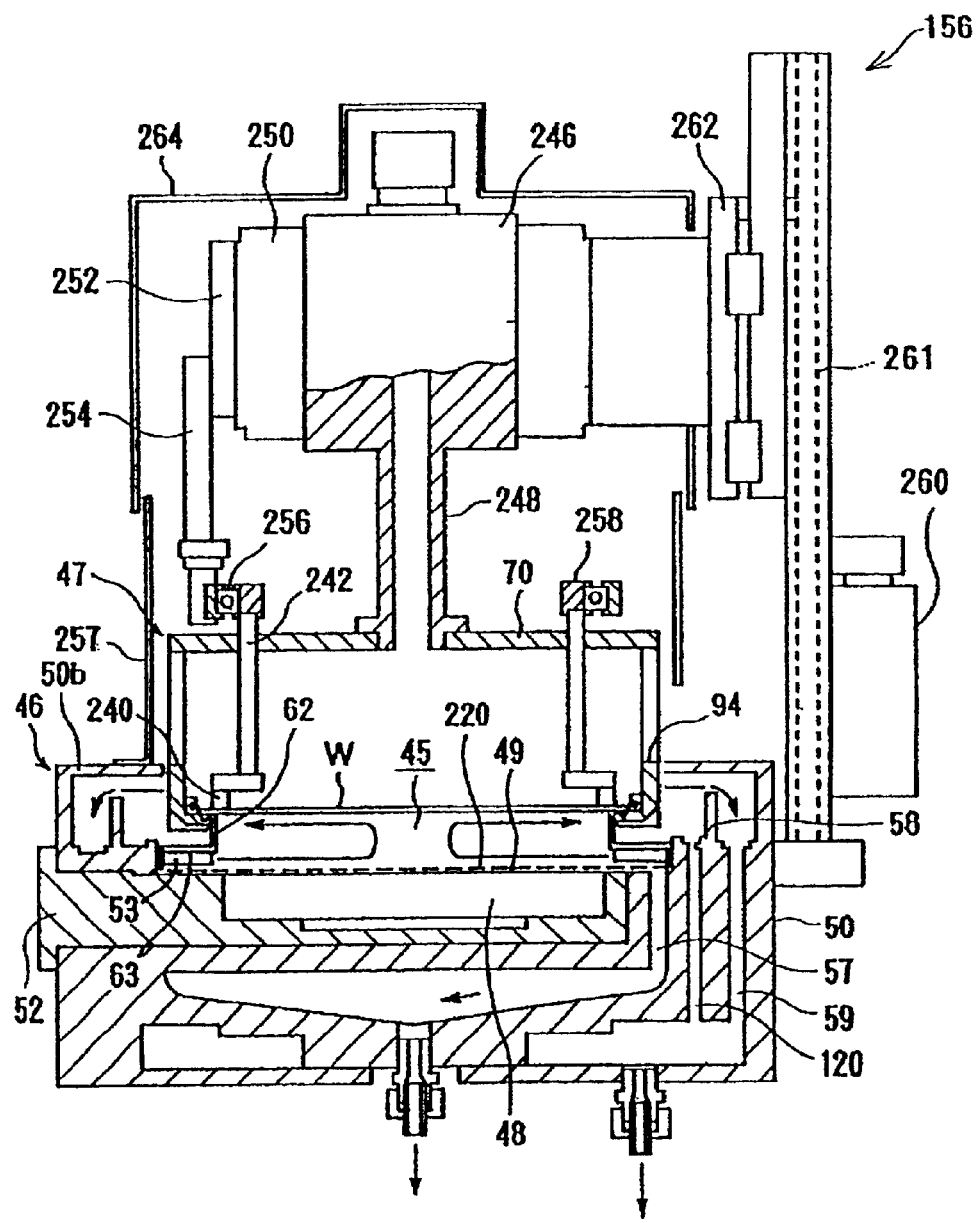
FIG. 15 is an entire cross-sectional view showing a still further example of the substrate processing unit.

FIGS. 15 to 23 show another example of the substrate processing unit of the present invention. As shown in FIG. 15, this substrate processing unit possesses a plating processing vessel 46 with an almost cylindrical shape containing a plating solution 45 and a head section 47 located above the plating processing vessel 46 for securing the substrate W, as major sections.

The plating processing vessel 46 has a plating chamber 49 with an open top and an anode 48 in the bottom. A plating vessel 50 for containing the plating solution 45 is provided in the plating chamber 49. A plurality of plating solution injection nozzles 53, each horizontally projecting from the inner wall of the plating vessel 50 toward the center of the plating vessel 50, are arranged along the perimeter at regular intervals. These plating solution injection nozzles 53 are connected to a plating solution supply pipe vertically extending inside the plating vessel 50.

In addition, in this example, a punched plate 220 with a number of holes with a diameter of about 3 mm, for example, is provided above the anode 48 in the plating chamber 49. This prevents black films formed on the surface of the anode 48 from being wound by the plating solution 45 and flowing out.

Figure 21:
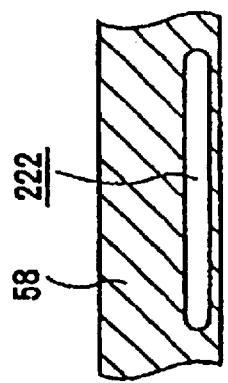
FIGS. 21(a)–21(d) are drawings illustrating the plating liquid flow during the plating operation and non-plating operation of the substrate processing unit of FIG. 15.
Figure 21:
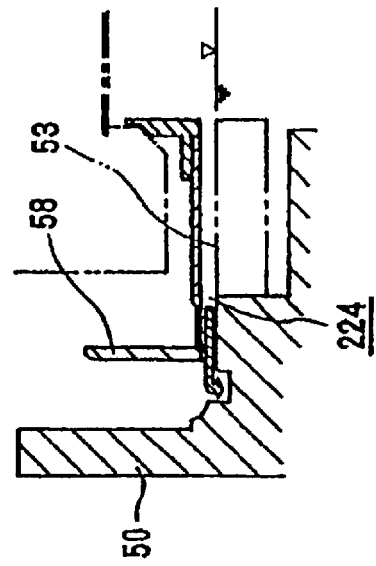
Figure 21:
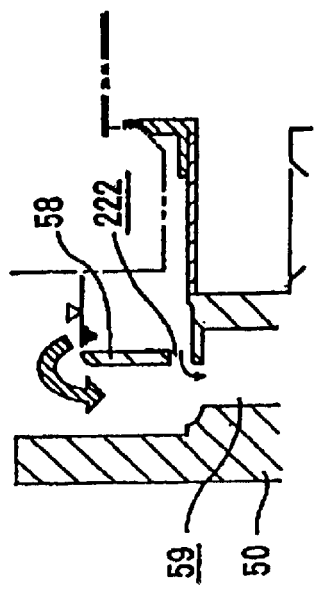
Figure 21:
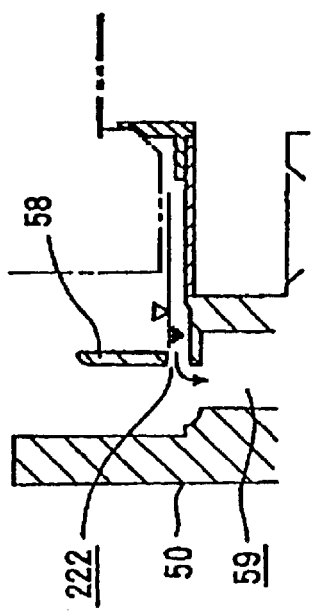

The plating vessel 50 is provided with a first plating solution outlet 57 to remove the plating solution 45 in the plating chamber 49 from the periphery of the bottom of the plating chamber 49, a second plating solution outlet 59 to discharge the plating solution 45 flowing over a dam 58 provided in the upper section of the plating vessel 50, a third plating solution outlet 120 to discharge the plating solution 45 before flowing over the dam 58, and openings 222 with a specified width provided at regular intervals below the dam 58, as shown in FIG. 21.

This configuration allows the plating solution to be discharged from the third plating solution outlet 120 when the amount of plating is large during the plating operation and, at the same time, allows the plating solution to flow over the dam 58 and also to be discharged from the second plating solution outlet 59 via the openings 222, as shown in FIG. 21(a). On the other hand, when the amount of plating supplied is small during the plating operation, the plating solution is discharged to the outside from the third plating solution outlet 120 and, at the same time, discharged to the outside from the second plating solution outlet 59 via the openings 222 as shown in FIG. 21(b). In this manner, the operation can easily conform to the amount of plating.

Furthermore, as shown in FIG. 21(d), through-holes 224 for controlling the liquid level are provided connecting the plating chamber 49 and the second plating solution outlet 59 at regular intervals along the circumference above the plating solution injection nozzle 53. This allows the liquid surface level of the plating solution to be controlled by causing the plating solution to pass through the through-holes 224 and discharging the solution from the second plating solution outlet 59 when there is no plating operation. The through-holes 224 also have a function similar to an orifice during the plating operation, whereby the plating solution flowing out can be controlled.

Figure 16:
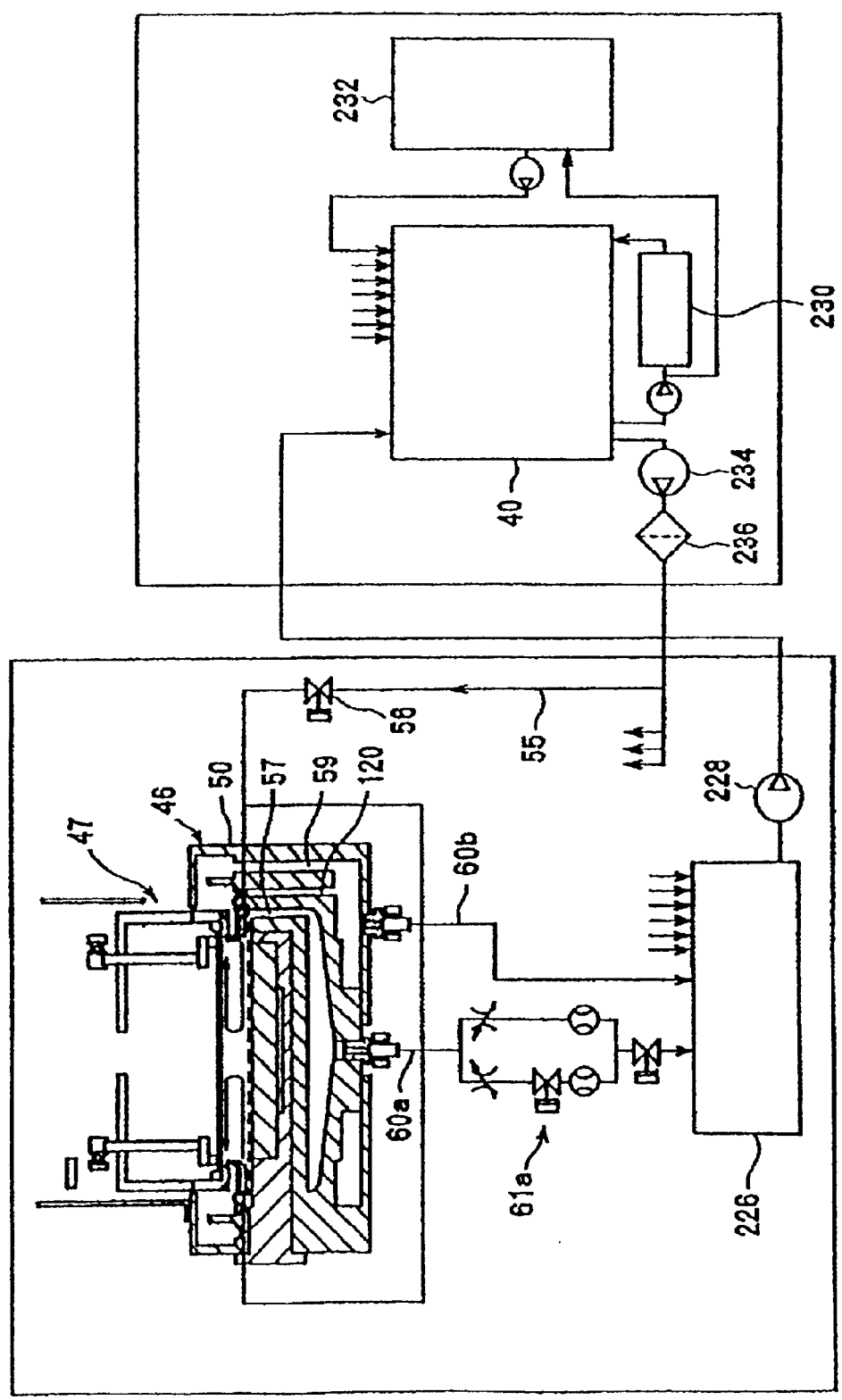
FIG. 16 is a plating liquid flow diagram showing the plating liquid flow in the substrate processing unit of FIG. 15.
Figure 17:
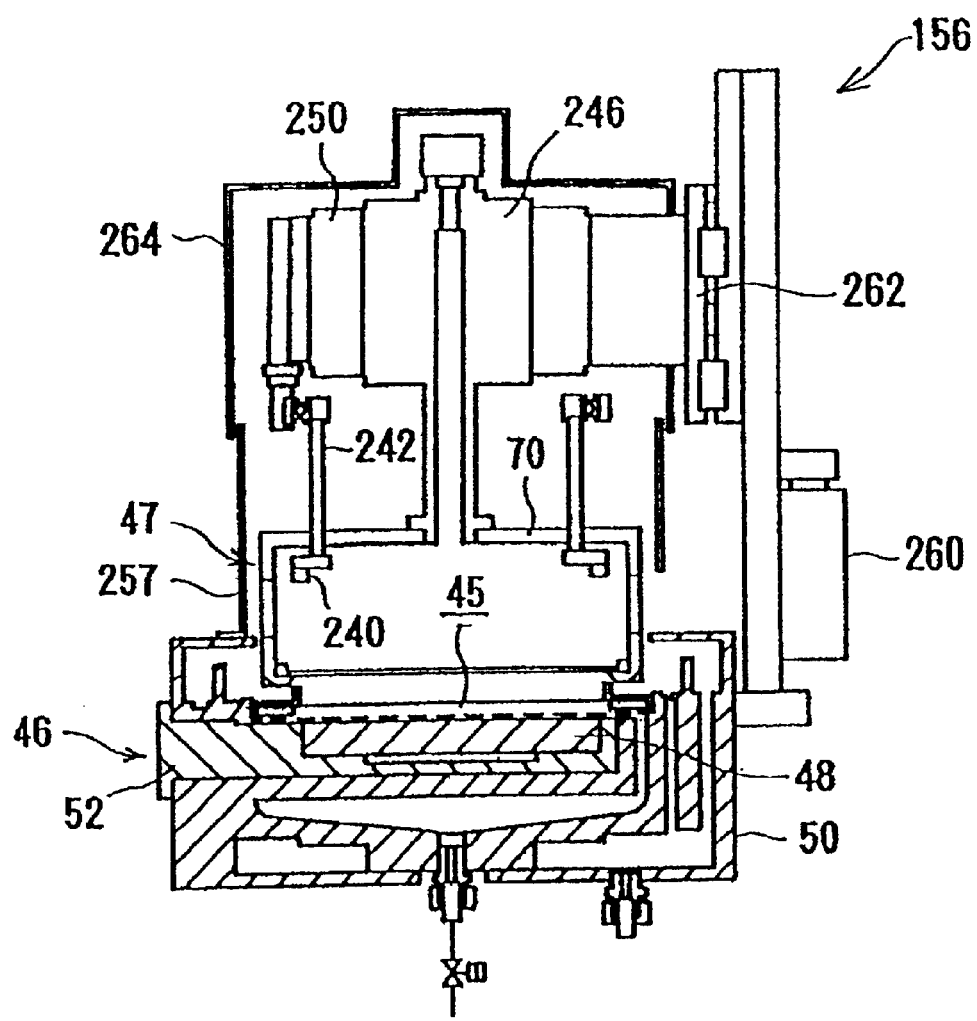
FIG. 17 is a cross-sectional view of the entire substrate processing unit of FIG. 15 during a non-plating operation (substrate receiving-delivering operation).

As shown in FIG. 16, the first plating solution outlet 57 is connected to a reservoir 226 via a plating solution discharge pipe 60a. A flow rate regulator 61a is provided in the plating solution discharge pipe 60a. The second plating solution outlet 59 and the third plating solution outlet 120 are joined in the plating vessel 50, then directly connected to the reservoir 226 via the plating solution discharge pipe 60 b.

The plating solution 45 entering the reservoir 226 is fed from the reservoir 226 to a plating solution control tank 40 by a pump 228. The plating solution control tank 40 is equipped with a temperature controller 230 and a plating solution analyzer 232 which collects and analyzes sample solutions. The plating solution 45 is supplied from plating solution control tank 40 to the plating solution injection nozzle 53 of the copper plating unit 156 through a filter 236 by a single pump 234. A control valve 56 for maintaining a constant secondary side voltage of the solution is provided in the plating solution supplying pipe 55 extending from the plating solution control tank 40 to the copper plating unit 156.

Now, turning back to FIG. 15, a vertical rectification ring 62 is provided in the plating chamber 49 near the circumference thereof. The vertical rectification ring 62 causes the center of the plating solution surface to be pushed upward by an upward stream of the plating solution 45 in the plating chamber 49 and renders a downward stream smooth and, at the same time, homogenizes the current density distribution. Also provided is a horizontal rectification ring 63 with the end of the circumference secured to the plating vessel 50.

Figure 19:
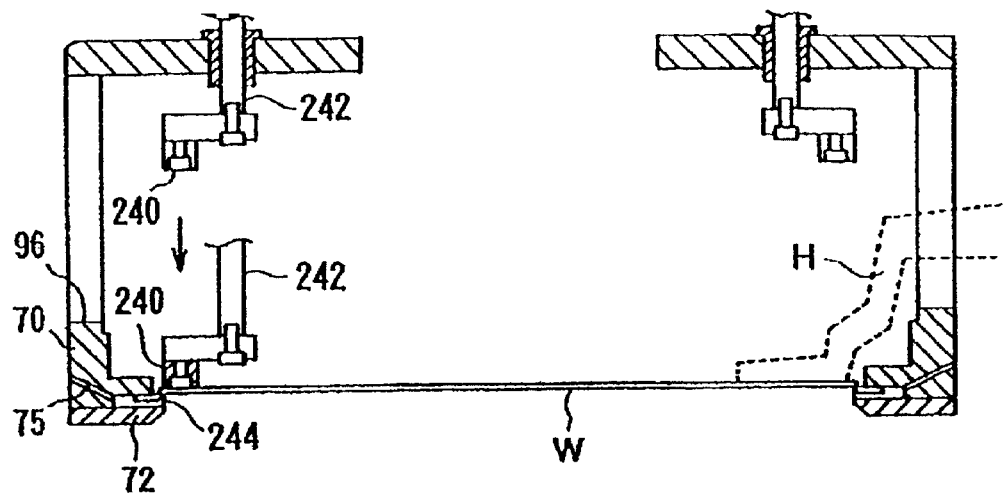
FIG. 19 is a cross-sectional view illustrating the relationship among the housing, press ring, and substrate during a substrate receiving-delivering operation of the substrate processing unit of FIG. 15.
Figure 20:
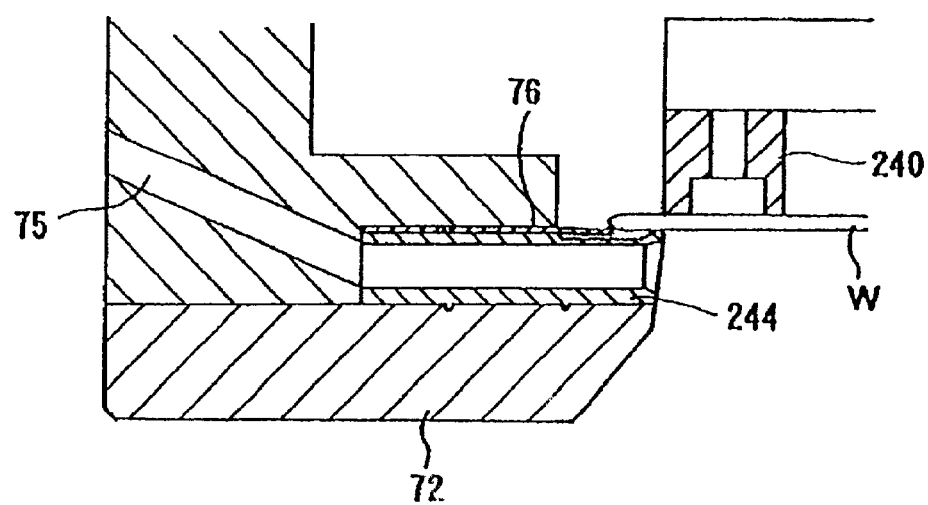
FIG. 20 is a partial enlarged view of FIG. 19.

On the other hand, the head section 47 is provided with a freely rotatable cylindrical housing 70 with a bottom, opened downward, and an aperture 94 on the side wall and a vertically movable press rod 242 with a press ring 240 attached to the lower end. As shown in FIGS. 19 and 20, provided at the lower end of the housing 70 is a substrate holder 72 which is an inwardly projecting ring. The substrate holder 72 is provided with a sealing material 244, which is also an inwardly projecting ring, with the tip on the surface upwardly projecting in the shape of a spire. A cathode electrode contact point 76 is disposed above the sealing material 244. In addition, air vent holes 75 extending horizontally toward the circumference and further extending outwardly with a slope upwardly are radially provided at regular intervals in the substrate holder 72.

This configuration enables, under the conditions in which the level of the plating liquid 45 is lowered as shown in FIG. 15, holding the substrate W with an adsorption hand H, putting it into the housing 70, and placing it on the surface of the sealing material 244 of the substrate holder 72, as shown in FIGS. 19 and 20, then after drawing out the adsorption hand H from the housing 70, causing the press ring 240 to descend. In this manner, it is possible to hold the substrate W by squeezing its periphery between the sealing material 244 and the press ring 240, to securely seal the bottom of the substrate W and the sealing material 244 by pressing them when the substrate W is held, and at the same time, to electrically connect the substrate W and the cathode electrode contact point 76.

Again referring to FIG. 15, the housing 70 is connected with an output axis 248 of a motor 246 and is configured to rotate by being driven by the motor 246. The press rod 242 is vertically installed at a prescribed position along the perimeter of a support frame 258 with the shape of a ring freely rotatably supported at the lower end of a vertically movable slider 254 via a bearing 256 by the action of a cylinder 252 equipped with a guide which is secured to a supporting body 250 surrounding the motor 246. This configuration allows the press rod 242 to move vertically by the action of a cylinder 252 and, at the same time, to rotate integrally with the housing 70 holding the substrates W.

The supporting body 250 is attached to a vertically movable slide base 262 engaged with a ball bearing 261 which rotates by being driven by the motor 260. The supporting body 250 is further surrounded by an upper housing 264 and configured to vertically move together with the upper housing 264 driven by the motor 260. In addition, the plating vessel 50 is provided with a lower housing 257 which surrounds the housing 70 during a plating operation on the surface thereof.

Figure 18:
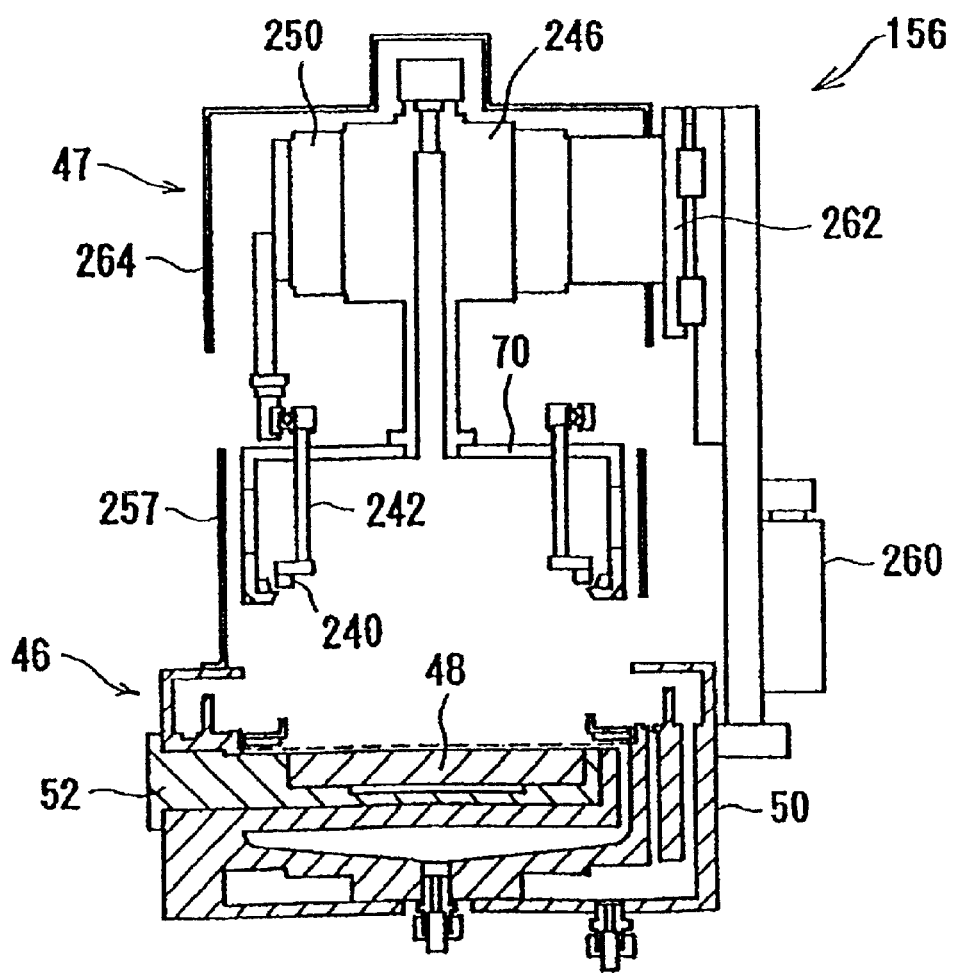
FIG. 18 is a cross-sectional view of the entire substrate processing unit of FIG. 15 during maintenance.

This configuration allows maintenance to be carried out on the unit under conditions in which the supporting body 250 and the upper housing 264 are elevated, as shown in FIG. 18. Crystals of the plating solution tend to become easily attached to the inner wall of the dam 58. However, such attachment of plating solution crystals can be prevented if a large quantity of plating solution is caused to overflow the dam 58 by maintaining the supporting body 250 and the upper housing 264 elevated. The plating vessel 50 has integrally provided therewith a cover 50b which covers the overflowing plating solution during the plating operation to prevent the plating solution from splashing. Attachment of the plating solution crystals to the bottom surface of the cover 50b can be avoided by coating the bottom surface with a super-water repelling material such as HIREC (NTT Advance Technology Co., Ltd.).

Figure 22:
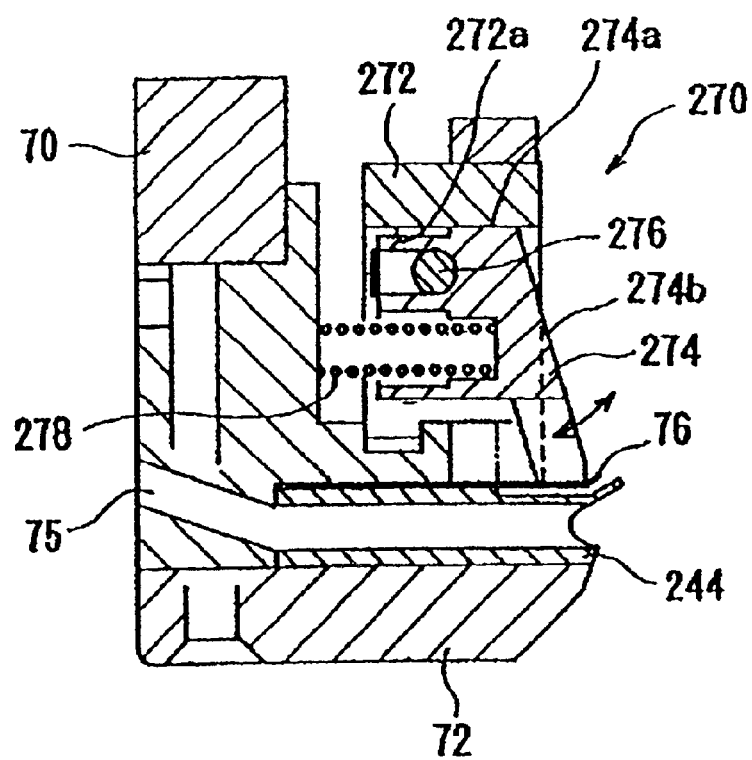
FIG. 22 shows an enlarged cross-sectional view of the wick-drawing mechanism of the substrate processing unit of FIG. 15.

Substrate wick-drawing mechanisms 270 to draw out the wick of the substrate W are provided in the upper part of the substrate holder 72 of the housing 70 at four points in this example along the perimeter. FIG. 22 shows details of the substrate wick-drawing mechanisms 270, which have a gate-shaped bracket 272 and secured to the housing 70 and a positioning block 274 installed in the bracket. The positioning block 274 is freely swingably supported by the bracket 272 at the upper portion via a horizontally secured pivot 276. In addition, a compression coil spring 278 is installed between the housing 70 and the positioning block 274. This configuration allows the positioning block 274 to be pushed forward around the pivot 276 via the compression coil spring 278 so that its lower end inwardly projects. The upper surface 274a functions as a stopper and comes into contact with the bottom of the upper side 272a of the bracket 272, thereby regulating the movement of the positioning block 274. The inner surface of the positioning block 274 is in the form of a taper 274b extending upward and outward.

This configuration enables drawing out the wick of a substrate in the following manner. When the substrate is transferred to the housing 70 by being held by an adsorption hand such as a carriage robot, for example, and placed on the substrate holder 72, the positioning block 274 turns outward resisting the spring force of the compression coil spring 278 if the center of the substrate deviates from the center of the substrate holder 72. If the adsorption hand such as a carriage robot releases the substrate, the positioning block 274 reverts to the original location due to the spring force of the compression coil spring 278, whereby the wick of the substrate can be drawn out.

Figure 23:
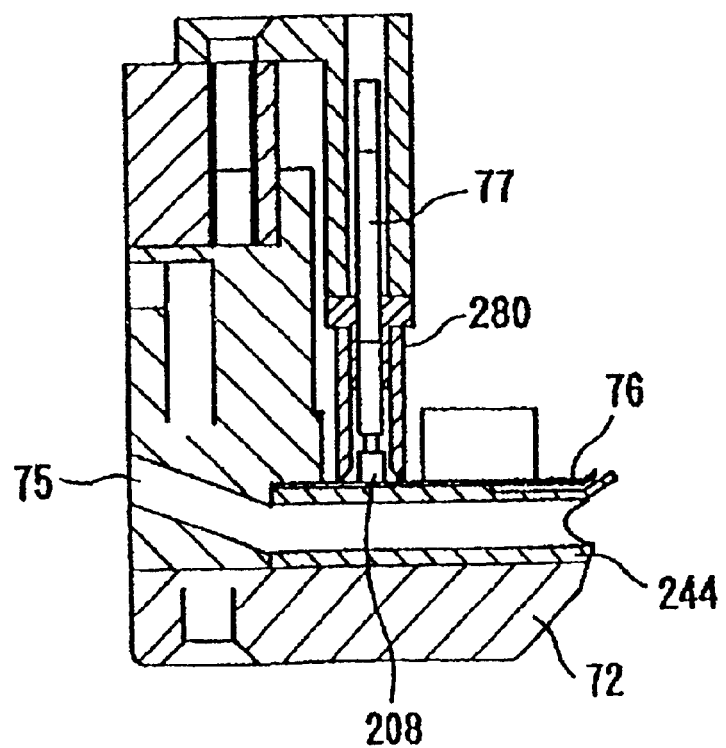
FIG. 23 is a cross-sectional view showing a power supply contact point (probe) of the substrate processing unit of FIG. 15.

FIG. 23 shows a feed contact point (probe) 77 for supplying electricity to the cathode electrode board 208 of the contact point 76 for the cathode electrode. The feed contact point (probe) 77 consists of a plunger and is enclosed by a cylindrical protective body 280 which extends to the cathode electrode board 208, whereby the feed contact point (probe) 77 is protected from the plating solution.

The method of plating using this substrate processing unit 2-0 will now be described. First, when a substrate is delivered to the substrate processing unit 2-0, the adsorption hand (not shown in the drawing) of the carriage robot and the substrate W held adsorbed by the hand with the surface directed downward are inserted into the housing 70 from the aperture 94 thereof After causing the adsorption hand to descend, vacuum adsorption is released to place the substrate W on the substrate holder 72 of the housing 70. Then, the adsorption hand is elevated to pull it from the housing 70. Next, the press ring 240 is caused to descend to hold the substrate W by squeezing the periphery between the substrate holder 72 and the bottom of the press ring 240.

Then, the plating solution 45 is injected from the plating solution injection nozzle 53 and, at the same time, the housing 70 and the substrate W held therein are caused to rotate at a medium rate. After several seconds from the time when the plating solution 45 has been fed to a prescribed level, the rotational speed of the housing 70 is decreased (for example to 100 min −1). Then, electrolytic plating is carried out by causing a current to flow between the anode 48 and the substrate acting as a cathode.

After turning off the electricity, the amount of the plating solution supplied is decreased so that the plating solution may flow out only from the through-hole 224 of the liquid level controller which is provided above the plating solution injection nozzle 53 as shown in FIG. 21(d), whereby the housing 70 and the substrate W held by the housing 70 are exposed above the plating solution liquid level. The housing 70 and the substrate W held thereby are rotated at a high speed (for example, at 500–800 min−1) at a position above the liquid level to remove the plating solution by centrifugal force. After removing the plating solution, the rotation of the housing 70 is stopped so that the housing 70 may face a specified direction.

After the housing 70 has completely stopped rotating, the press ring 240 is elevated. Next, the adsorption hand of the carriage robot 28*b* (not shown) is inserted into the housing 70 from the aperture 94 of the housing 70, with the adsorption surface facing downward. The adsorption hand is caused to descend to the position at which the adsorption hand can adsorb the substrate. Then, the substrate is adsorbed by the adsorption hand by vacuum adsorption and the adsorption hand is caused to move to the position above the aperture 94 of the housing 70 to deliver the adsorption hand and the substrate held thereby from the aperture 94 of the housing 70.

Using this substrate processing unit 2-0, the mechanism of the head section 47 is simplified and downsized; the plating operation is carried out when the liquid level of the plating solution in the plating vessel 46 is maintained appropriate for the plating operation, and the plating solution removing operation and substrate delivery operation are carried out when the liquid level is maintained appropriate for the substrate delivery operation. In addition, drying and oxidation of a black film formed on the surface of the anode 48 can be prevented.

Figure 24:
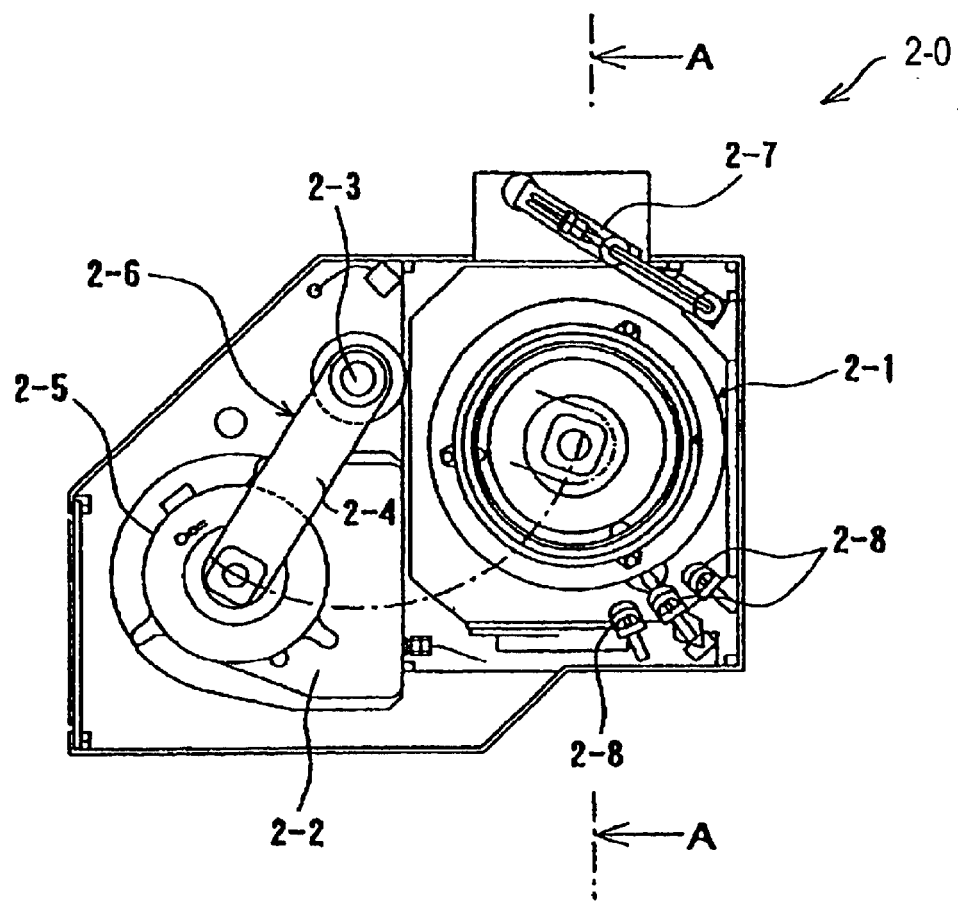
FIG. 24 is a plane view showing a still further example of the substrate processing unit using the plating method of the present invention.

FIGS. 24 to 29 show a still another example of the substrate processing unit using the plating method of the present invention. As shown in FIG. 24, this substrate processing unit has a substrate processing section 2-1 for carrying out plating and auxiliary operations and a plating solution tray 2-2 installed adjacent to the substrate processing section 2-1 for storing the plating solution. Also provided is an electrode arm section 2-6 comprising an electrode section 2-5, which is held at the end of an arm 2-4 movable around a shaft 2-3 and is movable between the substrate processing section 2-1 and the plating solution tray 2-2.

Figure 25:
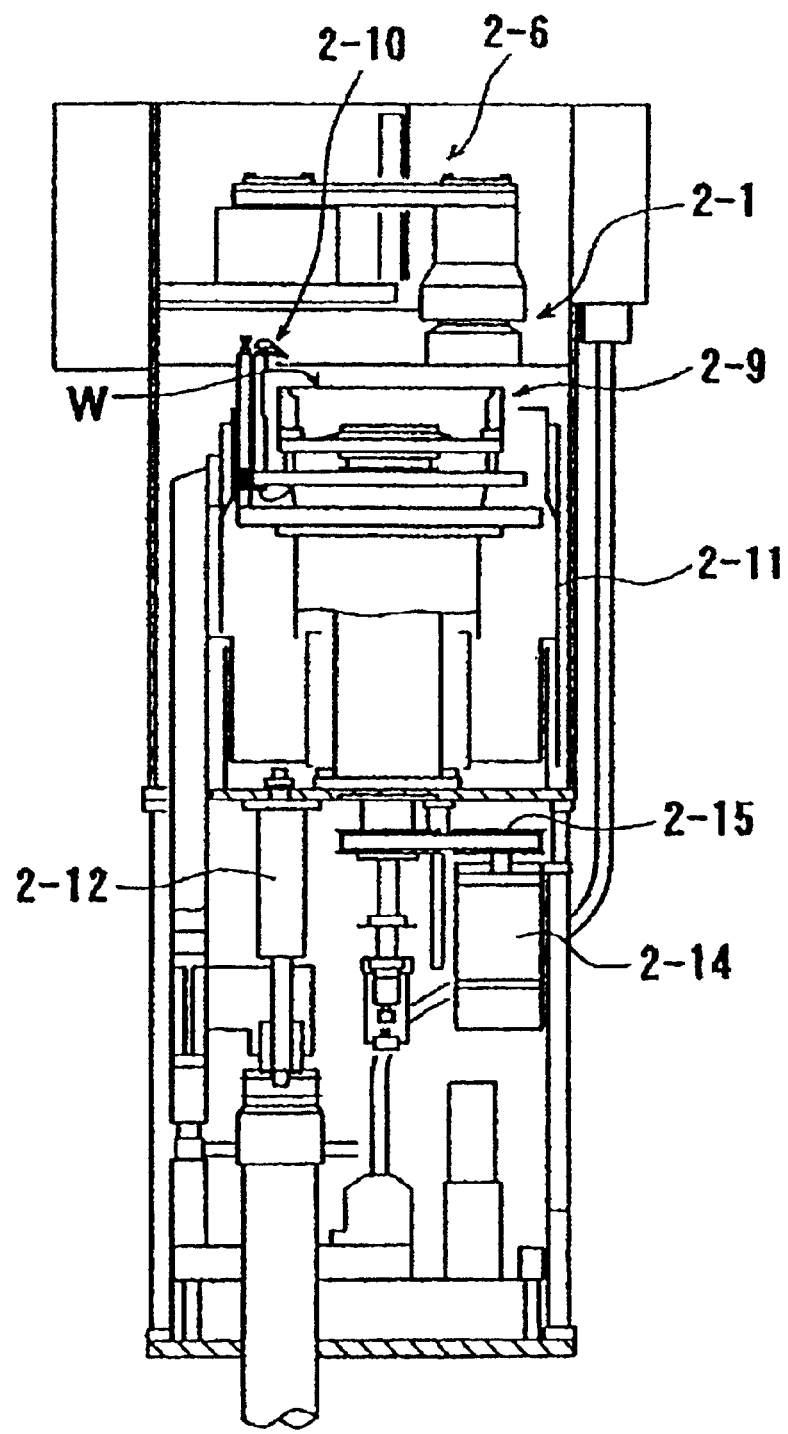
FIG. 25 is a cross-sectional view along the line A—A of FIG. 24.
Figure 26:
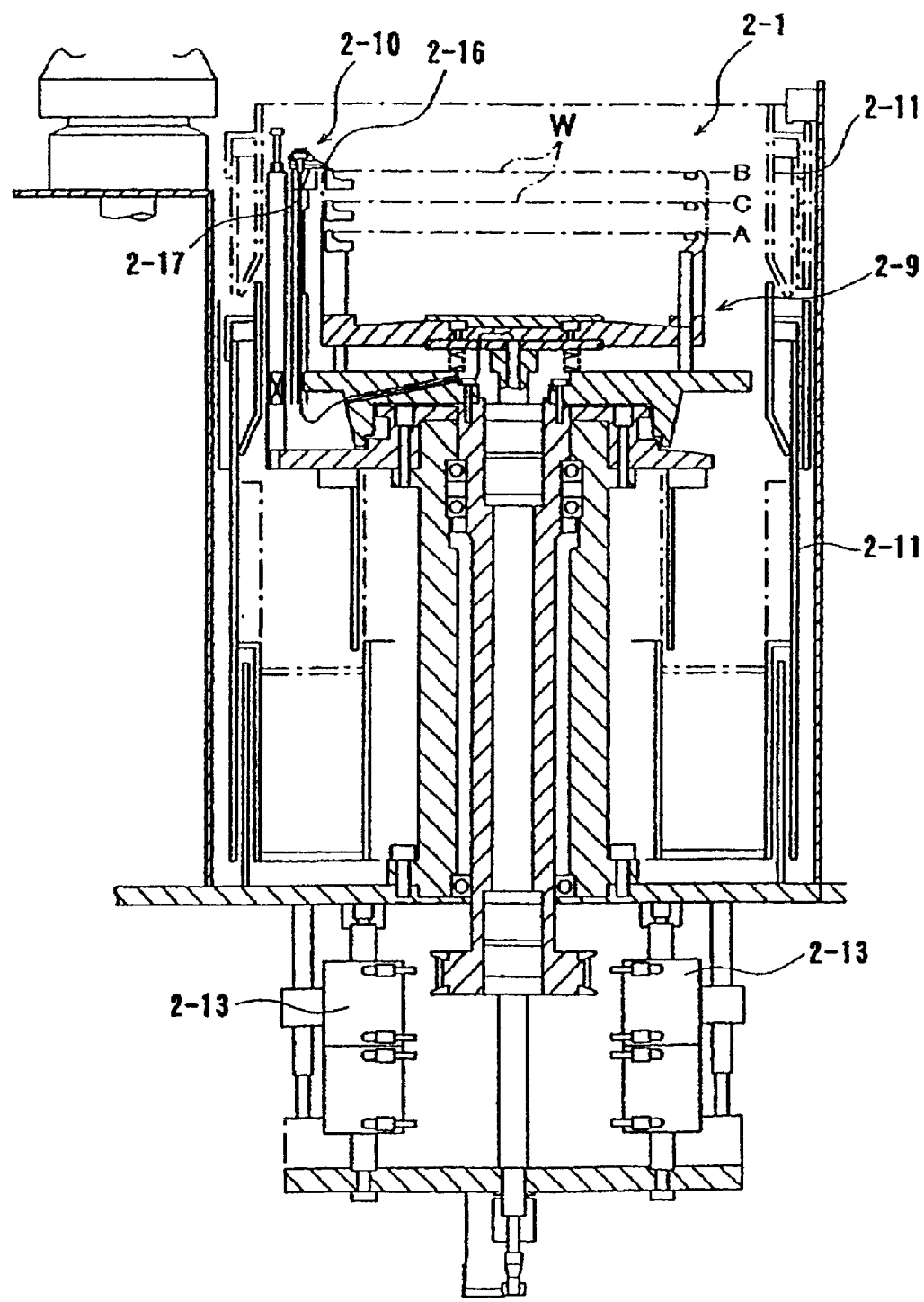
FIG. 26 is a cross-sectional view of a substrate holding section and cathode section of the substrate processing unit of FIG. 24.

In addition, a precoat-recovery arm 2-7 and fixed nozzles 2-8 for injecting chemical solutions such as purified water and ionized water as well as gases to the substrate are installed on the side of the substrate processing section 2-1. In this embodiment, three fixed nozzles 2-8 are arranged, one of which is used for supplying purified water. As shown in FIGS. 25 and 26, the substrate processing section 2-1 is equipped with a substrate holder 2-9 for holding the substrate W with the plating surface upward and a cathode section 2-10 installed so as to surround the periphery of the substrate holder 2-9 in the upper part thereof. In addition, an almost cylindrical cup 2-11 with a bottom for preventing splash of various chemical solutions used in the process is provided surrounding the circumference of the substrate holder 2-9 so that it can be moved vertically via an air cylinder 2-12.

The substrate holder 2-9 is designed so that it can be moved vertically by the air cylinder 2-12 between a lower substrate delivery point A and an upper plating point B, and an intermediate pre-treating/washing point C which lies between these points. The substrate holder 2-9 can rotate integrally with the cathode section 2-10 at an optional acceleration and speed via a rotation motor 2-14 and a belt 2-15. A substrate carrying-in/carrying-out entrance (not shown) is provided, opposing to the substrate delivery point A, on the side of a carriage robot (not shown) of the frame side of the electrolytic copper plating apparatus. When the substrate holder 2-9 is elevated to the plating point B, the periphery of the substrate W held by the substrate holder 2-9 comes into contact with a sealing material 2-16 of the cathode section 2-10, described below, and the cathode electrode 2-17. On the other hand, a cup 2-11 is provided so that the upper end may be positioned below the above-mentioned substrate carrying-in/carrying-out entrance and, when elevated as shown by a virtual line in FIG. 26, may come above the cathode section 2-10.

When the substrate holder 2-9 is elevated to the plating point B, a cathode electrode 2-17 is pressed against the periphery of the substrate W held by this substrate holder 2-9, permitting an electric current to be supplied to the substrate W. At the same time, the end of the inner circumference of a sealing material 2-16 comes into contact with and presses the periphery of the surface of the substrate W, thereby water-proofingly sealing the circumference. This not only prevents the plating solution supplied over the substrate W from leaking from the end of the substrate W, but also prevents the plating solution from polluting the cathode electrode 2-17.

Figure 27:
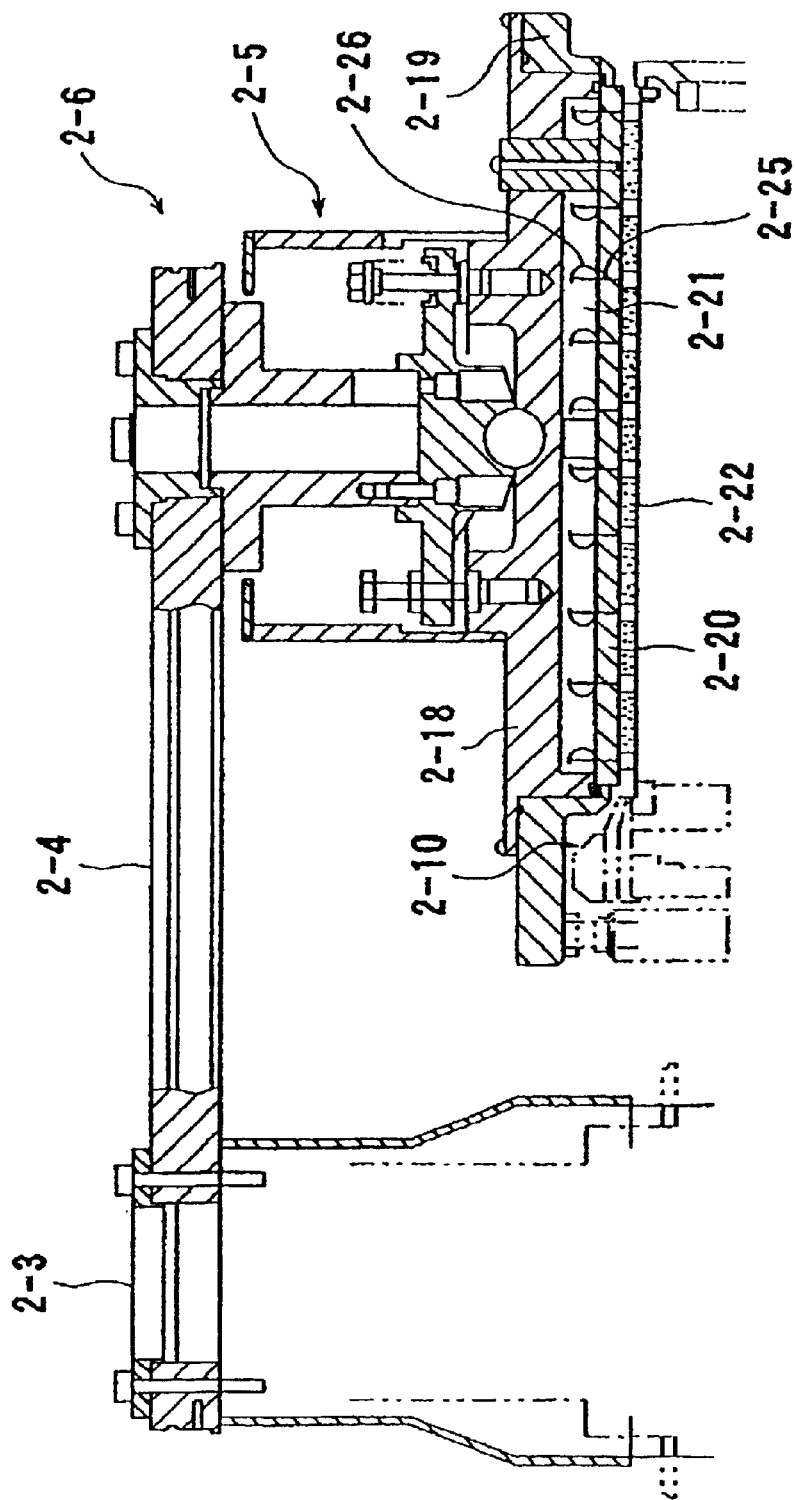
FIG. 27 is a cross-sectional view of an electrode arm section of the substrate processing device of FIG. 24.
Figure 28:
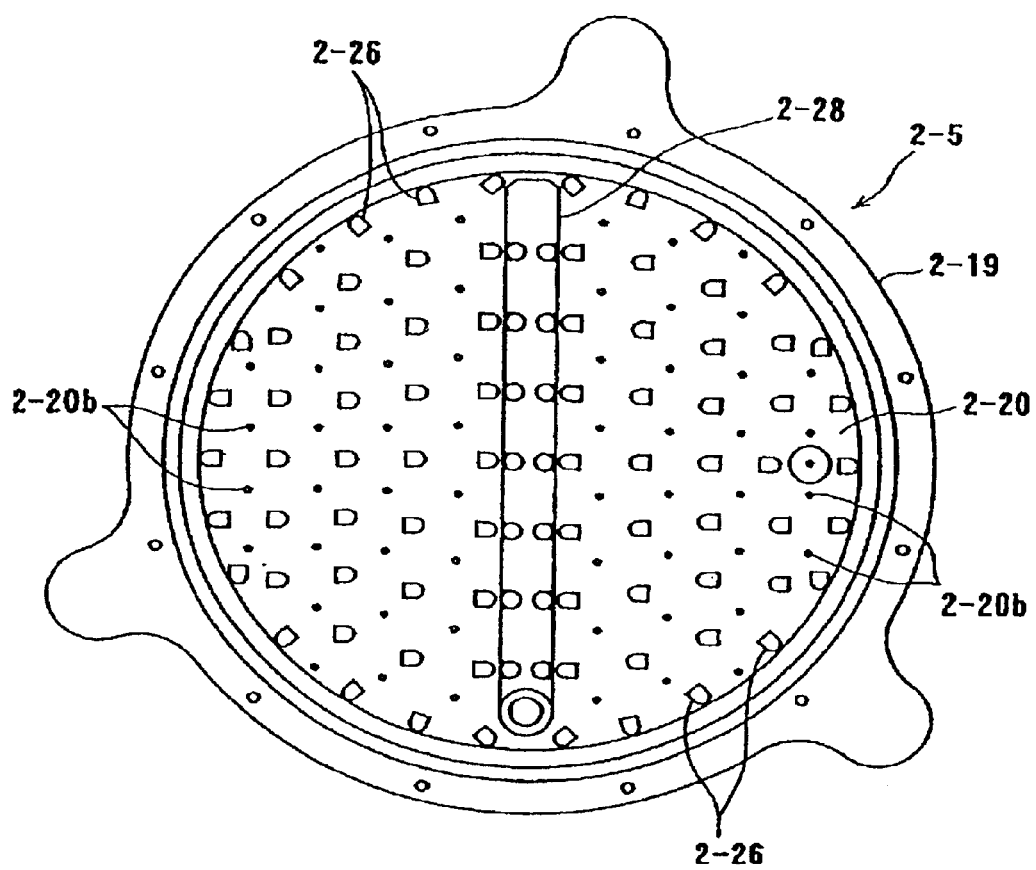
FIG. 28 is a cross-sectional view of an electrode arm section, excluding a housing, of the substrate processing unit of FIG. 24.
Figure 29:
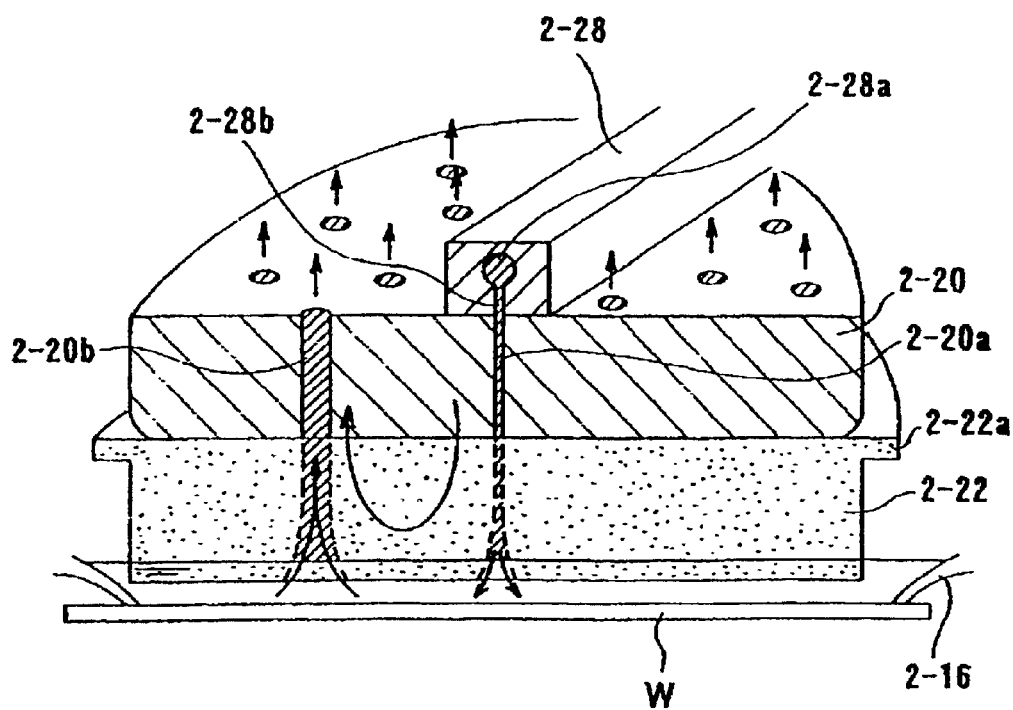
FIG. 29 is a schematic diagram showing an anode and a plating solution impregnating material of the substrate processing unit of FIG. 24.

As shown in FIG. 27, the electrode 2-5 of the electrode arm section 2-6 has a housing 2-18 at the free end of the rocking arm 2-4, a hollow support frame 2-19 surrounding the circumference of this housing 2-18, and an anode 2-20 of which the periphery is squeezed by the housing 2-18 and the support frame 2-19 to secure it. The anode 2-20 covers the opening of the housing 2-18, and a suction chamber 2-21 is formed in the housing 2-18. A plating solution introducing pipe 2-28 and a plating solution discharge pipe (not shown) to introduce and discharge the plating solution are connected to the suction chamber 2-21, as shown in FIGS. 28 and 29. In addition, the anode 2-20 has a number of holes 2-20*b* vertically provided through the entire surface.

In this embodiment, the bottom of the anode 2-20 is provided with a plating solution impregnating material 2-22 made from a water-retaining material which covers the entire surface of the anode 2-20. The surface of the anode 2-20 is moistened by the addition of a plating solution to the plating solution impregnating material 2-22, thereby preventing a black film from falling onto the plating surface of the substrate and, at the same time, making it easy to remove air when the plating solution is charged between the plating surface of the substrate and the anode 2-20. The plating solution impregnating material 2-22 is a woven or non-woven fabric or a sponge-shaped structural body made from at least one compound selected from the group consisting of polyethylene, polypropylene, polyester, polyvinyl chloride, teflon, polyvinyl alcohol, polyurethane, and derivatives of these compounds. Porous ceramics may also be used as a material for the plating solution impregnating material 2-22.

The plating solution impregnating material 2-22 is installed in the anode 2-20 as follows. Specifically, a number of securing pin 2-25 with a head at the lower end are used to join the plating solution impregnating material 2-22 and the anode 2-20, with the head of each securing pin 2-25 housed inside of the plating solution impregnating material 2-22 so that the pin does not come off upwardly and the axis penetrating the anode 2-20. The securing pin 2-25 is caused to move upward via a U-shaped leaf spring 2-26, whereby the plating solution impregnating material 2-22 becomes closely attached to the bottom of the anode 2-20 via the spring force of the leaf spring 2-26. In this manner, the plating solution impregnating material 2-22 is securely attached to the bottom of the anode 2-20 even if the thickness of the anode 2-20 is gradually decreased according to the progress of the plating. Faulty plating due to invasion of air between the bottom of the anode 2-20 and the plating solution impregnating material 2-22 can be prevented by this configuration.

Cylindrical pins made from PVC (polyvinyl chloride) or PET (polyethylene terephthalate) with a diameter of about 2 mm, for example, may be used by causing them to penetrate the anode from the upper side and applying an adhesive to the tip of the pins emerged from the bottom of the anode, whereby the anode can adhere and be secured to the plating solution impregnating material 2-22. Although the plating solution impregnating material may be used in contact with the anode, it is possible to provide a clearance between the anode and the plating solution impregnating material for holding the plating solution. The size of the clearance is less than 20 mm, preferably from 0.1 to 10 mm, and more preferably from 1 to 7 mm. When a dissolvable anode is used, the anode dissolves from the bottom. The clearance between the anode and the plating solution impregnating material increases over time in the range of about 0–20 mm.

When the substrate holder 2-9 is at the plating point B (see FIG. 26), the above-mentioned electrode section 2-5 descends until the clearance between the substrate W held by the substrate holder 2-9 and the plating solution impregnating material 2-22 becomes about 0.1–10 mm, preferably about 0.3–3 mm, and more preferably about 0.5–1 mm. In this condition, the plating solution is supplied from the plating solution feed pipe and fed to the space between the surface (plating side) of the substrate W and the anode 2-20, while causing the plating solution to be contained in the plating solution impregnating material 2-22. Then, a voltage is applied to the interface between the surface of the substrate W (the plating surface) and the anode 2-20 from a plating power supply source to produce plating on the plating surface of the substrate W.

The method of plating using this substrate processing unit 2-0 will now be described.

First, a substrate W before plating is delivered to the substrate holder 2-9 at the substrate delivery point A by a carriage robot 68 (not shown) and placed on the substrate holder 2-9. Next, a cup 2-11 is elevated and, at the same time, the substrate holder 2-9 is also elevated to the preprocessing-washing point C. In this condition, a precoat-recovery arm 2-7 which has been in a retired position is moved to the position opposing to the substrate W. A precoat solution comprising a surfactant, for example, is intermittently injected to the plating surface of the substrate W from a precoat nozzle provided at the tip of the precoat-recovery arm 2-7. In this instance, the precoat solution spreads all over the surface of the substrate W due to rotation of the substrate holder 2-9. Then, the precoat-recovery arm 2-7 is retuned to the retired position and the substrate holder 2-9 is rotated at a greater speed to remove the precoat solution from the plating surface of the substrate W by centrifugal force and dry the plating surface.

Next, the electrode arm section 2-6 is turned horizontally to cause the electrode 2-5 to come above the plating area from above the plating solution tray 2-2. Then, the electrode 2-5 is caused to descend toward the cathode section 2-10. When the electrode 2-5 has descended, a plating voltage is supplied to the anode 2-20 and the cathode section 2-10, the plating solution is supplied to the inside of the electrode section 2-5, then to the plating solution impregnating material 2-22 from a plating solution supply port attached to a pipe penetrating the anode 2-20. In this instance, the plating solution impregnating material 2-22 does not come into contact with the plating surface of the substrate W, but is at a distance of about 0.1–10 mm, preferably 0.3–3 mm, and more preferably 0.5–1 mm.

If supply of the plating solution continues, the plating solution containing copper ion oozing from the plating solution impregnating material 2-22 is fed to the clearance between the plating solution impregnating material 2-22 and the plating surface of the substrate W, whereby the plating surface of the substrate W is plated with copper. In this instance, the substrate holder 2-9 may be rotated at a low speed.

After completion of the plating process, the electrode arm section 2-6 is elevated and turned to return the electrode section 2-5 to the position over the plating solution tray 2-2. Then, the electrode section 2-5 is cause to descend to the normal position. Next, the precoat-recovery arm 2-7 is moved from the retired position to the position opposing to the substrate W, then it is caused to descend to reclaim the plating solution remaining on the substrate W using a plating solution recovery nozzle (not shown). After the recovery of the remaining plating solution, the precoat-recovery arm 2-7 is returned to the retired position, and purified water is injected into the center of the substrate W and, at the same time, the substrate holder 2-9 is rotated at an increased speed to replace the plating solution on the surface of the substrate W with purified water.

After this rinse operation, the substrate holder 2-9 is caused to descend from the plating point B to the preprocessing-washing point C. The substrate holder 2-9 and the cathode section 2-10 are washed with water by rotating them while supplying purified water from a stationary nozzle 2-8 for purified water. In this instance, the sealing material 2-16 and the cathode electrode 2-17 can be washed simultaneously with the substrate W using purified water supplied directly to the cathode section 2-10 or purified water scattered from the surface of the substrate W.

After washing with water, the supply of purified water from the stationary nozzle 2-8 is stopped. The substrate holder 2-9 and cathode section 2-10 are rotated at a greater speed to remove the purified water from the surface of the substrate W by centrifugal force and dry the surface. The sealing material 2-16 and the cathode electrode 2-17 are also dried together. After drying, rotation of the substrate holder 2-9 and cathode section 2-10 is stopped and the substrate holder 2-9 is moved to the substrate delivery point A.

The present invention is not limited to the embodiments described above. Many modifications and variations are possible within the scope of the technological concept described in the claims, specification, and drawings. Any configurations, structures, and materials which are not explicitly specified in the specification or drawings are included in the scope of the technological concept of the present invention inasmuch as they exhibit actions and effects of the present invention.

EXAMPLES

The present invention will be described in more detail by examples, which should not be construed as limiting the present invention.

Example 1

Evaluation of via-hole Filling Performance

Figure 30:
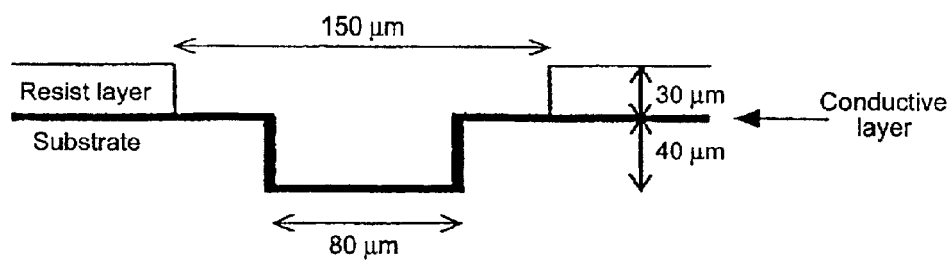
FIG. 30 schematically shows the structure of a blind via-hole section in the printed circuit board used in Example 1.

A patterned substrate with a configuration as shown in FIG. 30, having blind via-holes with a diameter of 80 $\mu$m and a depth of 40 $\mu$m and a pad with a diameter of 150 $\mu$m, and processed by electroless copper plating to provide electro conductivity was prepared. A LIZATRON process (Ebara-Udylite Co., Ltd.) was used for the electroless copper plating.

After the conductivity processing, the patterned substrate was plated with copper using the following seven copper plating baths (plating baths 1–4 of the present invention and comparative plating baths 1–3). Copper plating was carried out at 25° C. and a cathode current density of 2 A/dm$^2$ for 60 minutes with stirring by aeration.

Additives commonly used with printed circuit boards were used for the comparative plating baths 1 and 3. The comparative plating bath 1 has the same formulation as the plating bath of the present invention 1, except for the type of additives, whereas the comparative plating bath 3 is a high slow bath composition used for conventional printed circuit boards. The comparative plating bath 2 employs commercially available additives for a via-filling plating bath.

Figure 31:
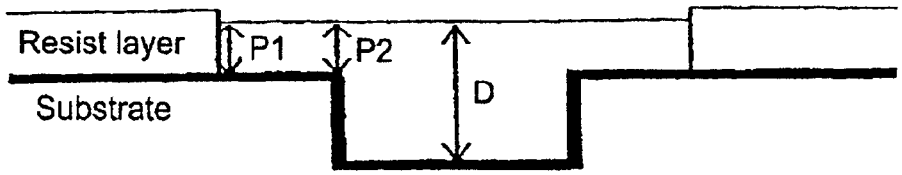
FIG. 31 is a drawing showing a measuring point for the cross-section thickness of a printed circuit board used in Example 1 after pattern plating.

Via-hole filling performance after plating was evaluated by grinding the section of the substrate pattern and measuring the plated thickness by a microscope. Areas of pads and via holes were measured for plated thickness. Two points, $P_1$ and $P_2$, shown in FIG. 31, were measured for the pad area and, for via-holes, the center of a via-hole, D in FIG. 31, was measured. The measured values were compared to determine via-hole filling performance. The results are shown in Table 1.

(Copper Sulfate Plating Bath Composition)

| Plating bath 1 of the present invention | |
|---|---|
| 1. Copper sulfate (pentahydrate) | 225 g/L |
| 2. Sulfuric acid (98%) | 55 g/L |
| 3. Chlorine ion | 60 mg/L |
| 4. Amine/glycidyl ether reaction condensate *1 | 250 mg/L |
| 5. SPS *2 | 6 mg/L |
| Plating bath 2 of the present invention | |
| 1. Copper sulfate (pentahydrate) | 150 g/L |
| 2. Methanesulfonic acid (MSA) | 80 g/L |
| 3. Chlorine ion | 40 mg/L |
| 4. Amine/glycidyl ether reaction condensate *1 | 150 mg/L |
| 5. MPS *3 | 0.5 mg/L |
| Plating bath 3 of the present invention | |
| 1. Cupric oxide | 70 g/L |
| 2. Methanesulfonic acid (MSA) | 100 g/L |
| 3. Chlorine ion | 40 mg/L |
| 4. Amine/glycidyl ether reaction condensate *1 | 100 mg/L |
| 5. Dithiocarbamic acid derivatives *4 | 4 mg/L |
| Plating bath 4 of the present invention | |
| 1. Cupric oxide | 70 g/L |
| 2. Propanol sulfonic acid | 80 g/L |
| 3. Chlorine ion | 60 mg/L |
| 4. Amine/glycidyl ether reaction condensate *1 | 400 mg/L |
| 5. SPS *2 | 2 mg/L |
| Comparative plating bath 1 | |
| 1. Copper sulfate (pentahydrate) | 225 g/L |
| 2. Sulfuric acid (98%) | 55 g/L |
| 3. Chlorine ion | 60 mg/L |
| 4. CU-BRITE TH *5 | 5 ml/L |
| Comparative plating bath 2 | |
| 1. Copper sulfate (pentahydrate) | 225 g/L |
| 2. Sulfuric acid (98%) | 55 g/L |
| 3. Chlorine ion | 60 mg/L |
| 4. Brightener for via-filling plating *6 | 20 ml/L |
| Comparative plating bath 3 | |
| 1. Copper sulfate (pentahydrate) | 75 g/L |
| 2. Sulfuric acid (98%) | 180 g/L |
| 3. Chlorine ion | 60 mg/L |
| 4. CU-BRITE TH *5 | 5 ml/L |

*1 KB12 (Goo Chemical Co., Ltd.)
*2 A compound with $L_2=L_3=C_3H_6$, $X_1=Y_1=SO_3H$ in the formula (XXII)
*1 The same as above.
*3 A compound with $L_1=C_3H_6$, $M_1=Na$ in the formula (XXI)
*1 The same as above.
*4 A compound with $R_3=R_4=C_2H_5$, $L_4=C_3H_6$, $X_2=SO_3H$ in the formula (XXIII)
*1 The same as above.
*2 The same as above.
*5 A product of Ebara-Udylite Co., Ltd.
*6 A product of Ebara-Udylite Co., Ltd.
*5 The same as above.

(Results)

TABLE 1

| | Plating bath of the present invention | | | | Comparative plating bath | | |
|---|---|---|---|---|---|---|---|
| | 1 | 2 | 3 | 4 | 1 | 2 | 3 |
| $P_1(\mu m)$ | 24 | 25 | 25 | 25 | 25 | 30 | 25 |
| $P_2(\mu m)$ | 25 | 25 | 25 | 25 | 24 | 18 | 25 |
| $P_1/P_2$ | 0.96 | 1 | 1 | 1 | 1.04 | 1.67 | 1 |
| $D(\mu m)$ | 67 | 64 | 63 | 65 | 22 | 46 | 24 |

As can be seen from the results shown in Table 1, the plating thickness (D) in the blind via-holes was equivalent to or slightly thinner than the surface ($P_1$ and $P_2$: pad area) if plated using the comparative plating bath 1 in which additives conventionally used for printed boards are used. In contrast, it was possible to fill the holes to a substantial depth of 60 $\mu$m in blind via-hole areas with copper by using the plating baths 1–4 of the present invention.

Although it was possible to fill via-holes using the comparative plating bath 2, the plating thickness near the end of the pad area ($P_1$: a resist side) tends to be greater than the thickness in the center of the hole ($P_2$). This tendency is not desirable because not only may impedance characteristics be adversely affected, but also resist application and via-on-via formation during lamination become difficult. In contrast, the entire surface was evenly plated with no increase in the plating thickness near the end when the plating baths 1–4 of the present invention were used.

Example 2

Evaluation of Film Thickness Uniformity in Pad Wiring Area

Figure 32:
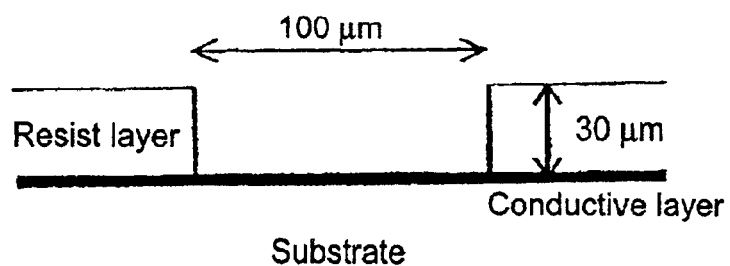
FIG. 32 schematically shows the structure of a wiring section in the package board used in Example 2.

A patterned substrate (line width: 100 $\mu$m, depth: 30 $\mu$m) shown in FIG. 32, modeling a package substrate used for MPU and the like was prepared. The patterned substrate was plated with copper using the plating bath 2 of the present invention and comparative plating bath 2 used in Example 1 under the same conditions as employed in Examples 1, to evaluate the film thickness uniformity in the wiring area.

Figure 33:
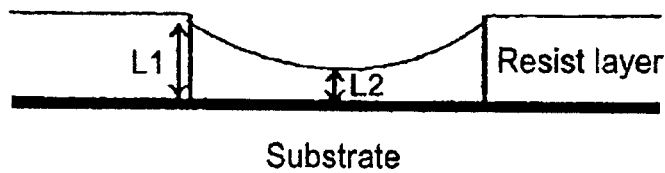
FIG. 33 is a drawing showing a measuring point for the cross-section thickness of a wiring section of the package board used in Example 2 after plating.

The evaluation was carried out in the same manner as in Example 1 according to the section film thickness measurement method using a microscope. The plate thickness at two points, the line end (resist side) $L_1$ and the center $L_2$, shown in FIG. 33 was measured for evaluation of film thickness uniformity in the pad wiring area. The results are shown in Table 2.

(Results)

TABLE 2

|  | $L_1$ (μm) | $L_2$ (μm) | $L_1/L_2$ |
|---|---|---|---|
| Plating bath 2 of the present invention | 25 | 24.5 | 1.02 |
| Comparative plating bath 2 | 28.5 | 23 | 1.24 |

As can be seen in Table 2, the wiring center ($L_2$) and the end ($L_1$: resist side) were plated to almost the same thickness using the plating bath of the present invention 2. In contrast, in the same manner as in the pad area in Example 1, the plating thickness in the resist side ($L_1$) was confirmed to be larger than the thickness in the center ($L_2$). These results suggest that because conventional plating solutions for via-filling utilize the effect of additives with a controlling diffusion rate for via-filling, these plating solutions are more easily affected by a flow of a fluid (a stirring rate or a thickness of diffusion layer). This may be a cause of the plated thickness fluctuation seen in the sample processed using the comparative plating bath 2. In contrast, plating with a uniform thickness was provided regardless of the flow rate of the fluid by using the additive of the present invention. Film thickness uniformity was excellent.

Example 3

Through-hole Throwing Power Evaluation

To investigate possibility of applying the plating baths of the present invention to through-hole plating based on the results of Examples 1 and 2, the following throwing power test in through-holes was carried out.

A substrate (FR-4) with a thickness of 1.6 mm in which through-holes with a diameter of 1 mm and 0.3 mm were bored was used as a sample. The sample was processed by electroless copper plating using the same LIZATRON process as used in Example 1 to form an electroless copper plate with a thickness of 0.5 μm.

The through-holes of this substrate were plated using the plating bath 1 of the present invention and the comparative plating bath 2 at 25° C., a current density of 2 A/dm² for 70 minutes. For comparative evaluation, the same experiment was carried out using a conventional plating bath for through-holes (comparative plating bath 3).

Figure 34:
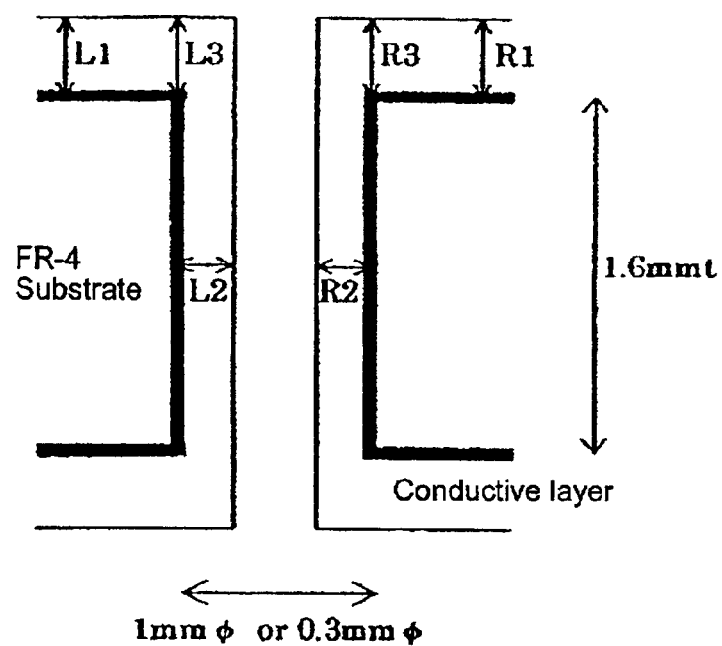
FIG. 34 is a drawing showing the through-hole cross-section structure of the through-hole board used in Example 3 and a measuring point for the film thickness after plating.

Throwing power (%) was determined by measuring the plating thickness in the center of the through-holes (left: $L_2$, right: $R_2$) and on the surface of the substrate (left: $L_1$, right: $R_1$), shown in FIG. 34 and applying the results to the following formula. In addition, the plating thickness on the through-hole corner (left: $L_3$, right: $R_3$) was also measured.

The results obtained for the 1 mm through-holes and 0.3 mm through-holes are shown respectively in Tables a 3 and 4.

(Calculation of Throwing Power)

$$\text{Throwing power (\%)} = \{(L_2+R_2)/(L_1+R_1)\} \times 100 \quad (X)$$

(Results: diameter 1 mm Through-holes)

TABLE 3

|  | $L_1$ | $L_2$ | $L_3$ | $R_1$ | $R_2$ | $R_3$ | Throwing power (%) |
|---|---|---|---|---|---|---|---|
|  | (μm) |  |  |  |  |  |  |
| Plating bath 1 of the present invention | 27 | 25 | 26 | 27 | 25 | 26 | 93 |
| Comparative plating bath 2 | 27 | 26 | 21 | 27 | 19 | 10 | 83 |
| Comparative plating bath 3 | 27 | 26 | 27 | 27 | 26 | 26 | 96 |

TABLE 4

|  | $L_1$ | $L_2$ | $L_3$ | $R_1$ | $R_2$ | $R_3$ | Throwing power (%) |
|---|---|---|---|---|---|---|---|
|  | (μm) |  |  |  |  |  |  |
| Plating bath 1 of the present invention | 27 | 28 | 27 | 27 | 28 | 27 | 104 |
| Comparative plating bath 2 | 27 | 25 | 19 | 27 | 16 | 7 | 76 |
| Comparative plating bath 3 | 27 | 26 | 24 | 27 | 25 | 10 | 94 |

As can be seen from the results in Tables 3 and 4, the plating bath of the present invention exhibited a throwing power equivalent to or better than the conventional plating bath for through-holes. On the other hand, the sample processed using the comparative plating bath 2 has a significant plate thickness difference on the right side and left side of the through-hole inner wall. In addition, the plate thickness on one side of the corner was extremely small, indicating high risk of circuit breaking during the heat cycle test and the like. The same reason as mentioned in Example 2 is believed to be applied to the film thickness difference in this example.

Example 4

Evaluation of Plating Film Properties

Plated copper film properties are important in copper plating for print-circuit boards. In this example, properties of the copper film obtained using the plating bath of the present invention were compared with copper films obtained using a common plating bath for printed circuit boards (comparative plating bath 3) and a plating bath for decorative purpose (comparative plating bath 4).

(Measurement of Properties)

Copper plating using test plating baths was applied to stainless steel boards with a thickness of 50 μm, then the product was annealed at 120° C. for 60 minutes. The formed film was peeled from the stainless steel board and stripe test pieces with a width of 10 mm were prepared. Properties of the plating film were evaluated by measuring the elongation percentage and tensile strength of the film using a tension tester (auto-graph AGS-H500N manufactured by Shimazu Corp.). The results are shown in Table 5.

(Copper Sulfate Plating Bath Composition)

| Comparative plating bath 4 | |
|---|---|
| 1. Copper sulfate (pentahydrate) | 225 g/L |
| 2. Sulfuric acid (98%) | 55 g/L |
| 3. Chlorine ion | 60 mg/L |
| 4. Brightener for decorative copper plating *7 | 10 ml/L |

*7 UBAC# 1 (Ebara-Udylite Co., Ltd.)

(Results)

TABLE 5

|  | Elongation | Tensile strength | |
|---|---|---|---|
|  | % | × 10⁶ Pa | kgf/mm² |
| Plating bath 1 of the present invention | 18 | 294 | 30 |
| Plating bath 4 of the present invention | 19 | 284.2 | 29 |
| Comparative plating bath 3 | 20 | 284.2 | 29 |
| Comparative plating bath 4 | 10 | 343 | 35 |

Based on the results of Examples 1–4 each item was evaluated according to the following evaluation standard. An overall evaluation was made based on the results of evaluation for each item. The results are shown in Table 6.

Evaluation Criteria for Each Item
- ○: Appropriate to requirements
- Δ: There is some inappropriateness
- X: Inappropriate Evaluation Criteria for Overall Evaluation
- ⊚: Applicable to all items
- Δ: Applicable to part of the items
- X: Inapplicable (Overall Results)

TABLE 6

|  | Plating bath 1 of the present invention | Comparative plating bath 1 | Comparative plating bath 2 | Comparative plating bath 3 | Comparative plating bath 4 |
|---|---|---|---|---|---|
| Via-holl filling properties | ○ | X | ○ | X | — |
| Film thickness uniformity in pad wiring area | ○ | ○ | Δ | ○ | — |
| Through-hole throwing power | ○ | — | X | ○ | — |
| Plating film properties | ○ | — | ○ | ○ | X |
| Overall evaluation | ⊚ | X | Δ | X | X |

As shown in the above, via-filling plating by a pattern plating method which has conventionally been difficult is now possible by using the plating bath of the present invention. In addition, print-circuit boards with both through-holes and via-holes can be processed by one plating process using the plating bath of the present invention. Therefore, it is possible to efficiently fabricate high performance print-circuit boards having minute patterns such as a build-up substrate with high reliability.

Example 5

Evaluation of Plating Micro-circuit Board

Figure 35:
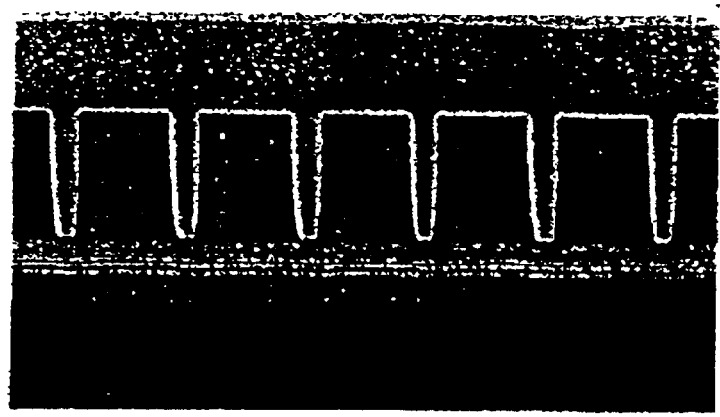
FIG. 35 is a cross-sectional photograph showing the inside of the via-hole of the silicon wafer used in Example 5.

A silicon wafer with a number of via-holes (diameter: 0.2 μm, depth: 1 μm (aspect ratio=5)) shown in FIG. 35 was provided as a micro-circuit board sample. To provide this sample board with electro conductivity, a copper seed layer with a thickness of 100 nm was formed by a sputtering method.

The sample board was plated using the plating baths having the following composition (plating baths 5–7 of the present invention) and the comparative plating baths 1–3 used in the previous examples at 24° C., a current density of 2.0 A/dm² for 150 seconds.

| Plating bath 5 of the present invention | |
|---|---|
| 1. Copper sulfate (pentahydrate) | 180 g/L |
| 2. Sulfuric acid (98%) | 25 g/L |
| 3. Chlorine ion | 10 mg/L |
| 4. Amine/glycidyl ether condensate *8 | 200 mg/L |
| 5. SPS *2 | 50 mg/L |
| Plating bath 6 of the present invention | |
| 1. Copper sulfate (pentahydrate) | 180 g/L |
| 2. Sulfuric acid (98%) | 25 g/L |
| 3. Chlorine ion | 30 mg/L |
| 4. Amine/glycidyl ether condensate *9 | 200 mg/L |
| 5. SPS *2 | 5 mg/L |
| Plating bath 7 of the present invention | |
| 1. Copper sulfate (pentahydrate) | 150 g/L |
| 2. Methanesulfonic acid (MSA) | 80 g/L |
| 3. Chlorine ion | 40 mg/L |
| 4. Amine/glycidyl ether condensate *10 | 200 mg/L |
| 5. SPS *2 | 5 mg/L |

*2 The same as above.
*8 A compound of the formula (XIII)
*2 The same as above.
*9 A compound of the formula (XI)
*2 The same as above.
*10 A compound of the formula (XVI)

FIB sections were prepared from the sample boards plated using the plating baths 5–7 of the present invention and the comparative plating baths 1–3. The inside of the via-holes was observed using an SEM (Model S-4700, manufactured by Hitachi, Ltd.). Section photographs are shown in FIGS. 36–40.

Figure 36:
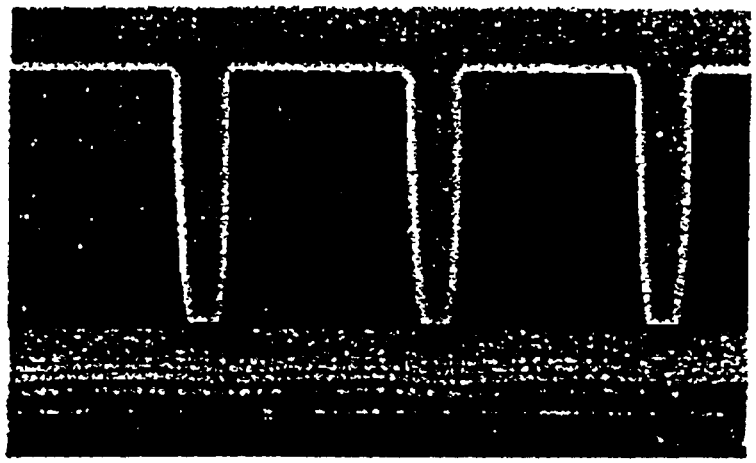
FIG. 36 is a cross-sectional photograph showing the inside of the via-hole after copper plating using the plating bath 5 of the present invention in Example 5.
Figure 37:
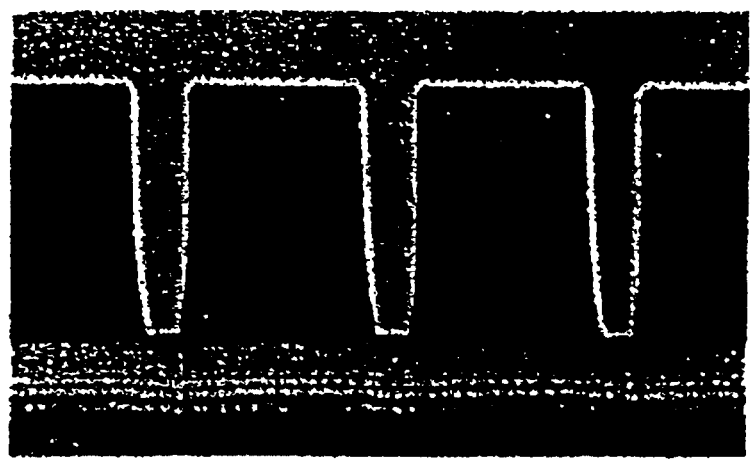
FIG. 37 is a cross-sectional photograph showing the inside of the via-hole after copper plating using the plating bath 6 of the present invention in Example 5.
Figure 38:
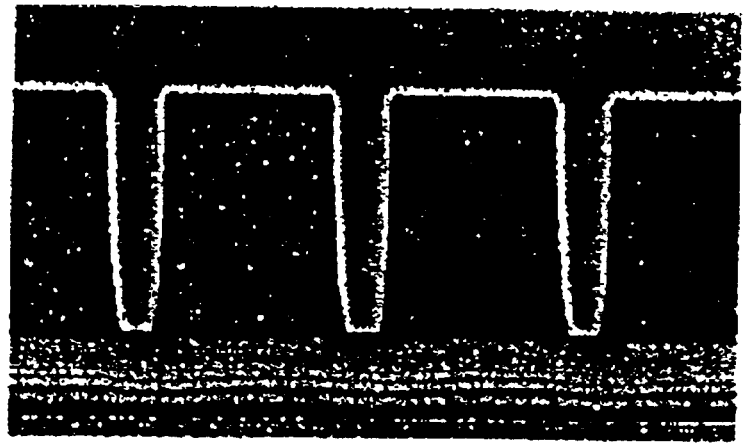
FIG. 38 is a cross-sectional photograph showing the inside of the via-hole after copper plating using the plating bath 7 of the present invention in Example 5.

From the results shown in FIGS. 36–38, via-holes of sample boards plated by the plating baths 5–7 of the present invention exhibited excellent filling performance without producing bottom voids and seam voids. The sample was also free from a conventional problem of producing dense pattern-thick film portions, called overplatings or humps.

Figure 39:
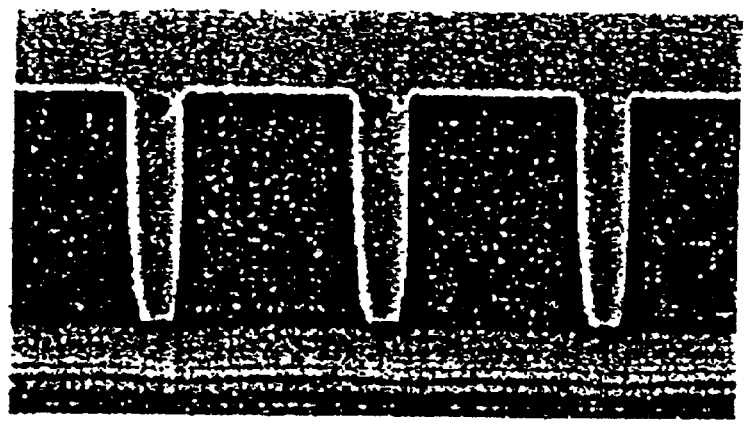
FIG. 39 is a cross-sectional photograph showing the inside of the via-hole after copper plating using the comparative plating baths 1 and 2 in Example 5.
Figure 40:
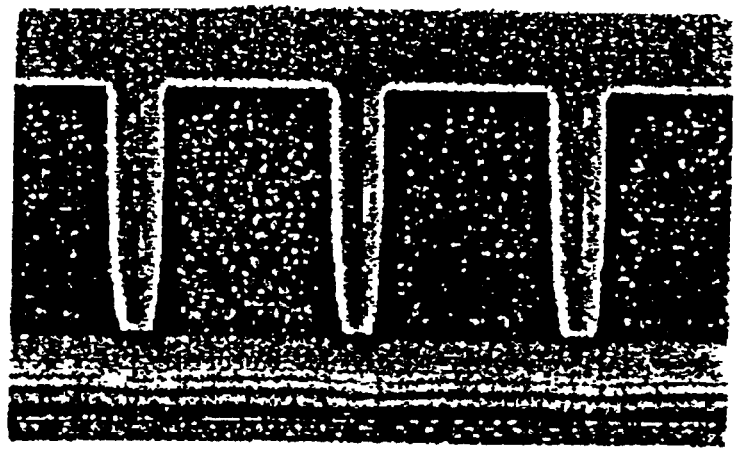
FIG. 40 is a cross-sectional photograph showing the inside of the via-hole after copper plating using the comparative plating bath 3 in Example 5.

On the other hand, as shown in FIG. 39, voids due to pinching off the openings of the holes were seen in the via-holes of the sample boards processed by the comparative plating baths 1 and 2. In addition, as shown in FIG. 40, seam-shaped voids were seen in the via-holes of the sample board processed by the comparative plating bath 3, confirming that these boards involve a risk of adversely affecting electrical characteristics.

Copper plating exhibiting excellent via-filling properties, superior plating uniformity, as well as excellent uniformity to co-existing through-holes can be obtained using the copper plating bath and plating method of the present invention. In addition, copper plating with high electric reliability can be produced on electronic circuit substrates such as a semiconductor wafer and printed board, in which circuit patterns are formed with minute wiring grooves. It is also possible to produce plating that allows easy analysis of all components. Therefore, printed circuit boards and substrates for electronic circuits having minute patterns with high reliability and high performance such as a build-up substrate can be efficiently manufactured at a low cost.

What is claimed is:

1. A copper electroplating bath comprising copper, a reaction condensate of an amine compound and glycidyl ether and/or a quaternary ammonium derivative of this reaction condensate.

2. The copper electroplating bath according to claim 1, having a copper concentration of 25–75 g/L.

3. The copper electroplating bath according to claim 2, wherein the copper comprises one or more copper compounds selected from the group consisting of copper sulfate, copper oxide, copper chloride, copper carbonate, copper pyrophosphate, a copper alkane sulfonate, a copper alkanol sulfonate, and a copper salt of organic acid are used as a copper ion source.

4. The copper electroplating bath according to claim 1, containing 10–1000 mg/L of the reaction condensate of an amine compound and glycidyl ether and/or a quaternary ammonium derivative of this reaction condensate.

5. The copper electroplating bath according to claim 1, containing 10–200 g/L of an organic acid or inorganic acid.

6. The copper electroplating bath according to claim 5, wherein one or more acids selected from the group consisting of sulfuric acid, an alkane sulfuric acid, and an alkanol sulfuric acid are used as the organic acid or inorganic acid.

7. The copper electroplating bath according to claim 1, containing one or more components selected from the group consisting of a sulfoalkyl sulfonic acid or its salt, a bissulfo organic compound, and a dithiocarbamic acid derivative at a concentration of 0.1–200 mg/L.

8. The copper electroplating bath according to claim 1, wherein the copper electroplating bath is acidic.

9. The copper electroplating bath according to claim 1, further comprising chlorine.

10. The copper electroplating bath according to claim 9, wherein the chlorine concentration is 0.01–100 mg/L.

11. The copper electroplating bath according to claim 1, allowing analytical control of all components in the electroplating bath, wherein the electroplating bath further comprises basic components and additives.

12. A method of electroplating a substrate comprising processing a patterned substrate by a conductivity treatment and electroplating the substrate using a copper comprising plating bath comprising a reaction condensate of an amine compound and glycidyl ether and/or a quaternary ammonium derivative of this reaction condensate.

13. The method of plating a substrate according to claim 12, wherein the conductivity treatment is carried out using a metal coating treatment by electroless plating, a direct plating method using carbon or palladium, sputtering, vapor deposition, or chemical vapor deposition (CVD).

14. The method of plating a substrate according to claim 12, wherein the plating bath contains 25–75 g/L of copper ion.

15. The method of plating a substrate according to claim 14, wherein the copper comprises one or more copper compounds selected from the group consisting of copper sulfate, copper oxide, copper chloride, copper carbonate, copper pyrophosphate, a copper alkane sulfonate, a copper alkanol sulfonate, and a copper salt of organic acid are used as a copper ion source.

16. The method of plating a substrate according to claim 12, wherein the copper plating bath contains 10–1000 mg/L of the reaction condensate of an amine compound and glycidyl ether and/or a quaternary ammonium derivative of this reaction condensate.

17. The method of plating a substrate according to claim 12, wherein the copper plating bath contains 10–200 g/L of an organic acid or inorganic acid.

18. The method of plating a substrate according to claim 17, wherein the copper comprises one or more acids selected from the group consisting of sulfuric acid, an alkane sulfuric acid, and an alkanol sulfuric acid are used as an organic acid or inorganic acid.

19. The method of plating a substrate according to claim 12, wherein the copper plating bath contains one or more components selected from the group consisting of a sulfoalkyl sulfonic acid or its salt, a bis-sulfo organic compound, and a dithiocarbamic acid derivative at a concentration of 0.1–200 mg/L.

20. The method of plating a substrate according to claim 12, wherein the copper plating bath is acidic.

21. The method of plating a substrate according to claim 12, wherein the copper plating bath further comprises chlorine.

22. The method of plating a substrate according to claim 21, wherein the chlorine concentration of the copper plating bath is 0.01–100 mg/L.

23. A method of electroplating a substrate comprising providing an electronic circuit board with minute circuit patterns and a metallic seed layer formed thereon and electroplating the electronic circuit board using a copper plating bath comprising copper a reaction condensate of an amine compound and glycidyl ether and/or a quaternary ammonium derivative of this reaction condensate.

24. The method of plating a substrate according to claim 23, wherein a conductivity treatment is carried out using a metal coating treatment by electroless plating, a direct plating method using carbon or palladium, sputtering, vapor deposition, or chemical vapor deposition (CVD).

25. The method of plating a substrate according to claim 23, wherein the plating bath contains 25–75 g/L of copper ion.

26. The method of plating a substrate according to claim 25, wherein the copper comprises one or more copper compounds selected from the group consisting of copper sulfate, copper oxide, copper chloride, copper carbonate, copper pyrophosphate, a copper alkane sulfonate, a copper alkanol sulfonate, and a copper salt of organic acid are used as a copper ion source.

27. The method of plating a substrate according to claim 23, wherein the copper plating bath contains 10–1000 mg/L of the reaction condensate of an amine compound and glycidyl ether and/or a quaternary ammonium derivative of this reaction condensate.

28. The method of plating a substrate according to claim 23, wherein the copper plating bath contains 10–200 g/L of an organic acid or inorganic acid.

29. The method of plating a substrate according to claim 28, wherein one or more acids selected from the group consisting of sulfuric acid, an alkane sulfuric acid, and an alkanol sulfuric acid are used as the organic acid or inorganic acid.

30. The method of plating a substrate according to claim 23, wherein the copper plating bath contains one or more components selected from the group consisting of a sulfoalkyl sulfonic acid or its salt, a bis-sulfo organic compound, and a dithiocarbamic acid derivative at a concentration of 0.1–200 mg/L.

31. The method of plating a substrate according to claim 23, wherein the copper plating bath is acidic.

32. The method of plating a substrate according to claim 23, wherein the copper plating bath further comprises chlorine.

33. An additive for a copper plating bath comprising a reaction condensate of an amine compound and glycidyl ether and/or a quaternary ammonium derivative of this reaction condensate, a sulfoalkyl sulfonic acid or its salt, a bis-sulfo organic compound, and a dithiocarbamic acid derivative, as effective components.

\* \* \* \* \*